(12) United States Patent
Yun et al.

(10) Patent No.: US 11,721,594 B2
(45) Date of Patent: Aug. 8, 2023

(54) DUAL CHANNEL GATE ALL AROUND TRANSISTOR DEVICE AND FABRICATION METHODS THEREOF

(71) Applicant: Taiwan Semiconductor Manufacturing Co., Ltd., Hsin-Chu (TW)

(72) Inventors: Wei-Sheng Yun, Taipei (TW); Chih-Hao Wang, Hsinchu County (TW); Jui-Chien Huang, Hsinchu (TW); Kuo-Cheng Chiang, Hsinchu County (TW); Chih-Chao Chou, Hsinchu (TW); Chun-Hsiung Lin, Hsinchu County (TW); Pei-Hsun Wang, Hsinchu (TW)

(73) Assignee: TAIWAN SEMICONDUCTOR MANUFACTURING COMPANY, LTD, Hsinchu (TW)

(*) Notice: Subject to any disclaimer, the term of this patent is extended or adjusted under 35 U.S.C. 154(b) by 0 days.

(21) Appl. No.: 17/805,962

(22) Filed: Jun. 8, 2022

(65) Prior Publication Data
US 2022/0301943 A1 Sep. 22, 2022

Related U.S. Application Data

(63) Continuation of application No. 17/114,147, filed on Dec. 7, 2020, now Pat. No. 11,532,521, which is a
(Continued)

(51) Int. Cl.
*H01L 21/8238* (2006.01)
*H01L 29/06* (2006.01)
(Continued)

(52) U.S. Cl.
CPC ............ *H01L 21/823821* (2013.01); *H01L 21/02532* (2013.01); *H01L 21/30604* (2013.01);
(Continued)

(58) Field of Classification Search
CPC ....... H01L 21/823821; H01L 21/02532; H01L 21/30604; H01L 21/324; H01L 21/823807;
(Continued)

(56) References Cited

U.S. PATENT DOCUMENTS 9,508,833 B1 11/2016 Leobandung et al.
9,755,017 B1 9/2017 Guillorn et al.
(Continued)

*Primary Examiner* — Igwe U Anya
(74) *Attorney, Agent, or Firm* — Haynes and Boone, LLP

(57) ABSTRACT

A semiconductor structure includes a fin disposed on a substrate, the fin including a channel region comprising a plurality of channels vertically stacked over one another, the channels comprising germanium distributed therein. The semiconductor structure further includes a gate stack engaging the channel region of the fin and gate spacers disposed between the gate stack and the source and drain regions of the fin, wherein each channel of the channels includes a middle section wrapped around by the gate stack and two end sections engaged by the gate spacers, wherein a concentration of germanium in the middle section of the channel is higher than a concentration of germanium in the two end sections of the channel, and wherein the middle section of the channel further includes a core portion and an outer portion surrounding the core portion with a germanium concentration profile from the core portion to the outer portion.

20 Claims, 17 Drawing Sheets

Related U.S. Application Data continuation-in-part of application No. 16/737,591, filed on Jan. 8, 2020, now Pat. No. 11,251,090, which is a continuation of application No. 16/366,946, filed on Mar. 27, 2019, now Pat. No. 10,804,162.

(60) Provisional application No. 62/737,269, filed on Sep. 27, 2018.

(51) Int. Cl.
| | |
|---|---|
| *H01L 21/02* | (2006.01) |
| *H01L 21/324* | (2006.01) |
| *H01L 29/423* | (2006.01) |
| *H01L 27/092* | (2006.01) |
| *H01L 29/08* | (2006.01) |
| *H01L 29/10* | (2006.01) |
| *H01L 21/306* | (2006.01) |
| *H01L 21/311* | (2006.01) |
| *H01L 21/027* | (2006.01) |
| *H01L 21/762* | (2006.01) |
| *H01L 29/66* | (2006.01) |

(52) U.S. Cl.
CPC .... *H01L 21/324* (2013.01); *H01L 21/823807* (2013.01); *H01L 21/823828* (2013.01); *H01L 27/0924* (2013.01); *H01L 29/0673* (2013.01); *H01L 29/0847* (2013.01); *H01L 29/1037* (2013.01); *H01L 29/42392* (2013.01); *H01L 21/0274* (2013.01); *H01L 21/31116* (2013.01); *H01L 21/76224* (2013.01); *H01L 21/823864* (2013.01); *H01L 21/823878* (2013.01); *H01L 29/6653* (2013.01); *H01L 29/66545* (2013.01)

(58) Field of Classification Search
CPC . H01L 21/823; H01L 21/828; H01L 21/0274; H01L 21/31116; H01L 21/76224; H01L 21/823864; H01L 21/823878; H01L 27/0924; H01L 29/0673; H01L 29/0847; H01L 29/1037; H01L 29/42392; H01L 29/6653
USPC .......................................................... 257/351
See application file for complete search history.

(56) References Cited

U.S. PATENT DOCUMENTS

| | | |
|---|---|---|
| 9,805,988 B1 | 10/2017 | Bentley |
| 10,892,328 B2 | 1/2021 | Song et al. |
| 2015/0303303 A1 | 10/2015 | Lauer et al. |
| 2017/0256611 A1 | 9/2017 | Kim et al. |
| 2019/0131395 A1* | 5/2019 | Lee ..................... H01L 29/0653 |
| 2019/0355723 A1* | 11/2019 | Miao ................. H01L 29/78684 |

\* cited by examiner

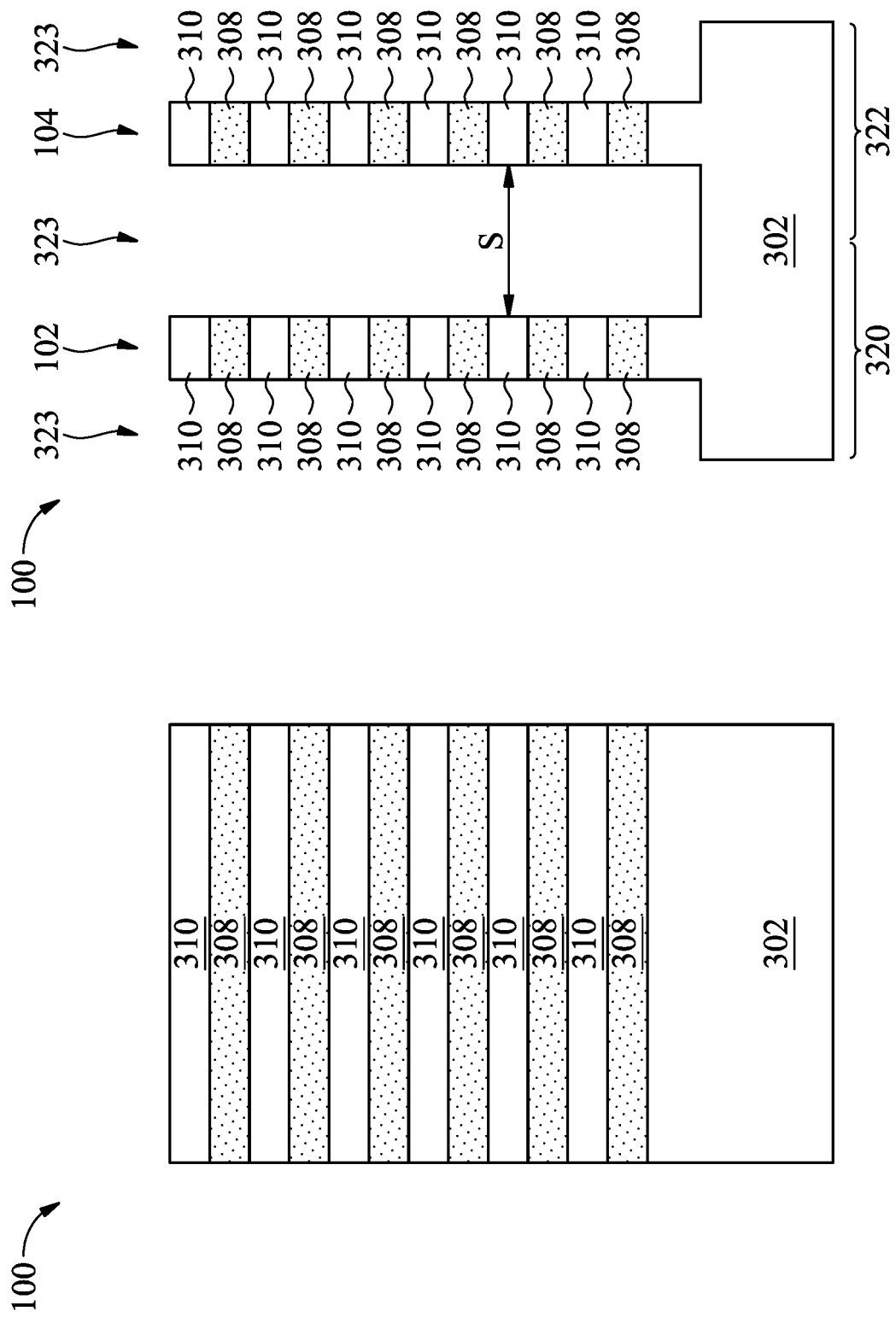

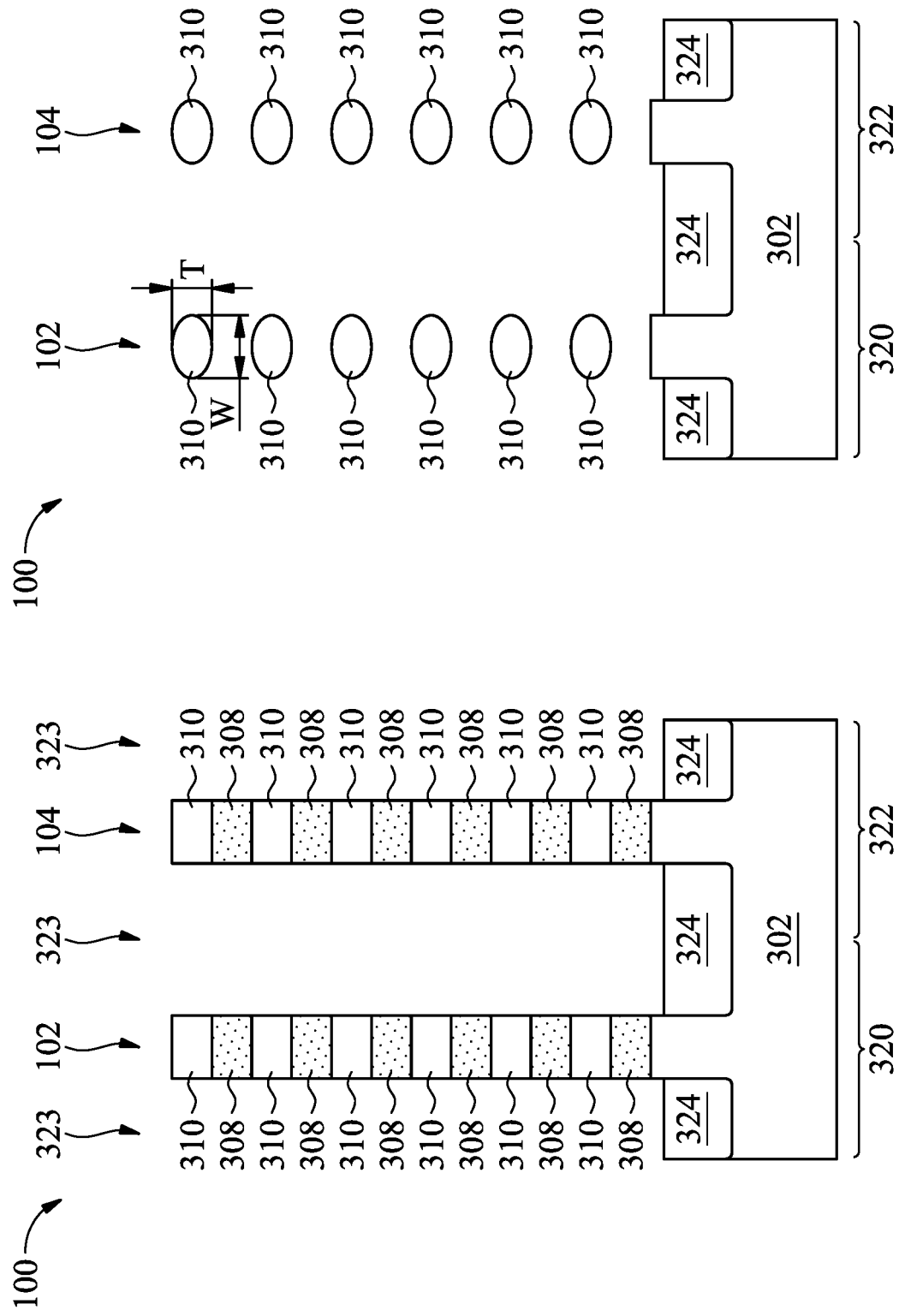

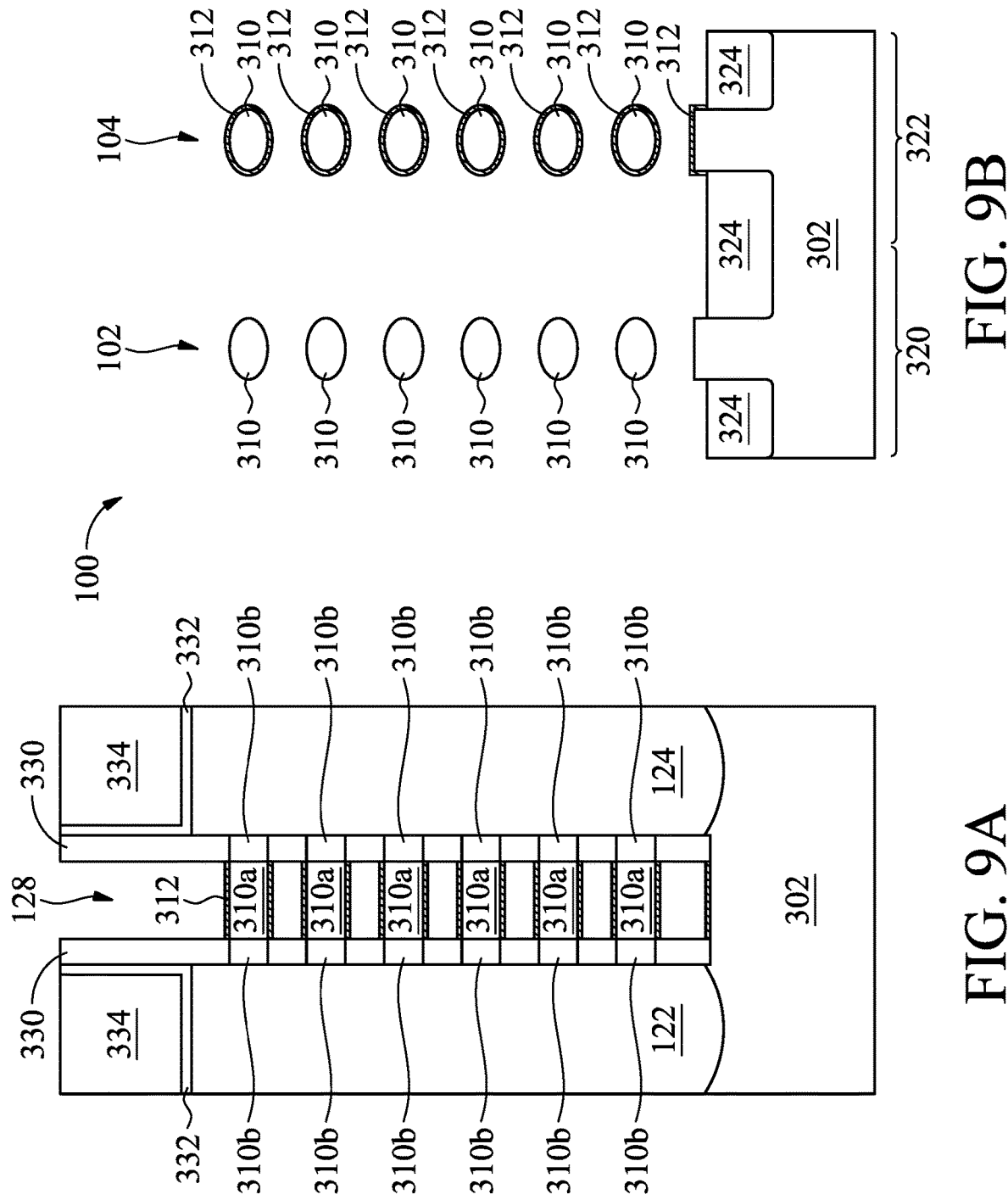

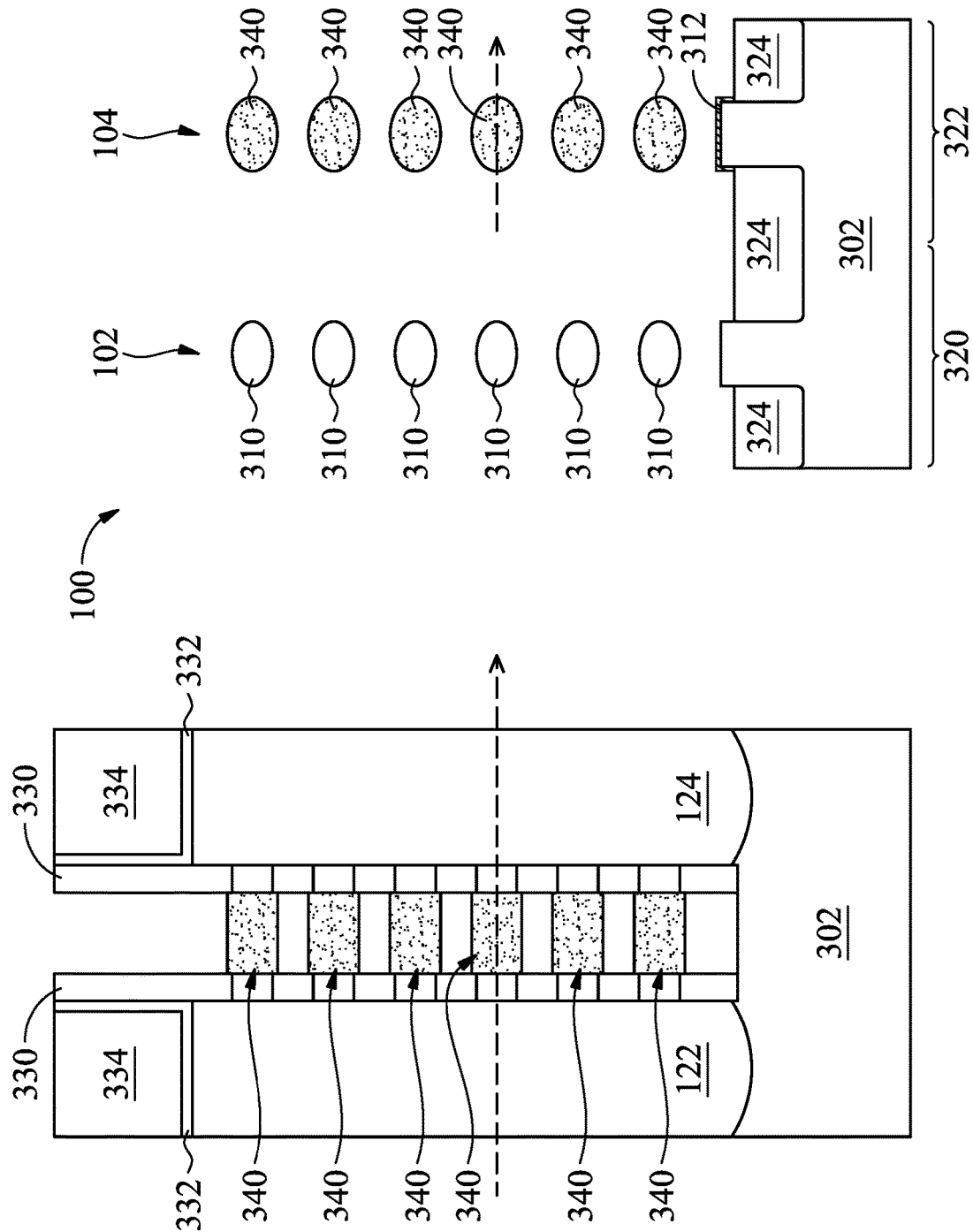

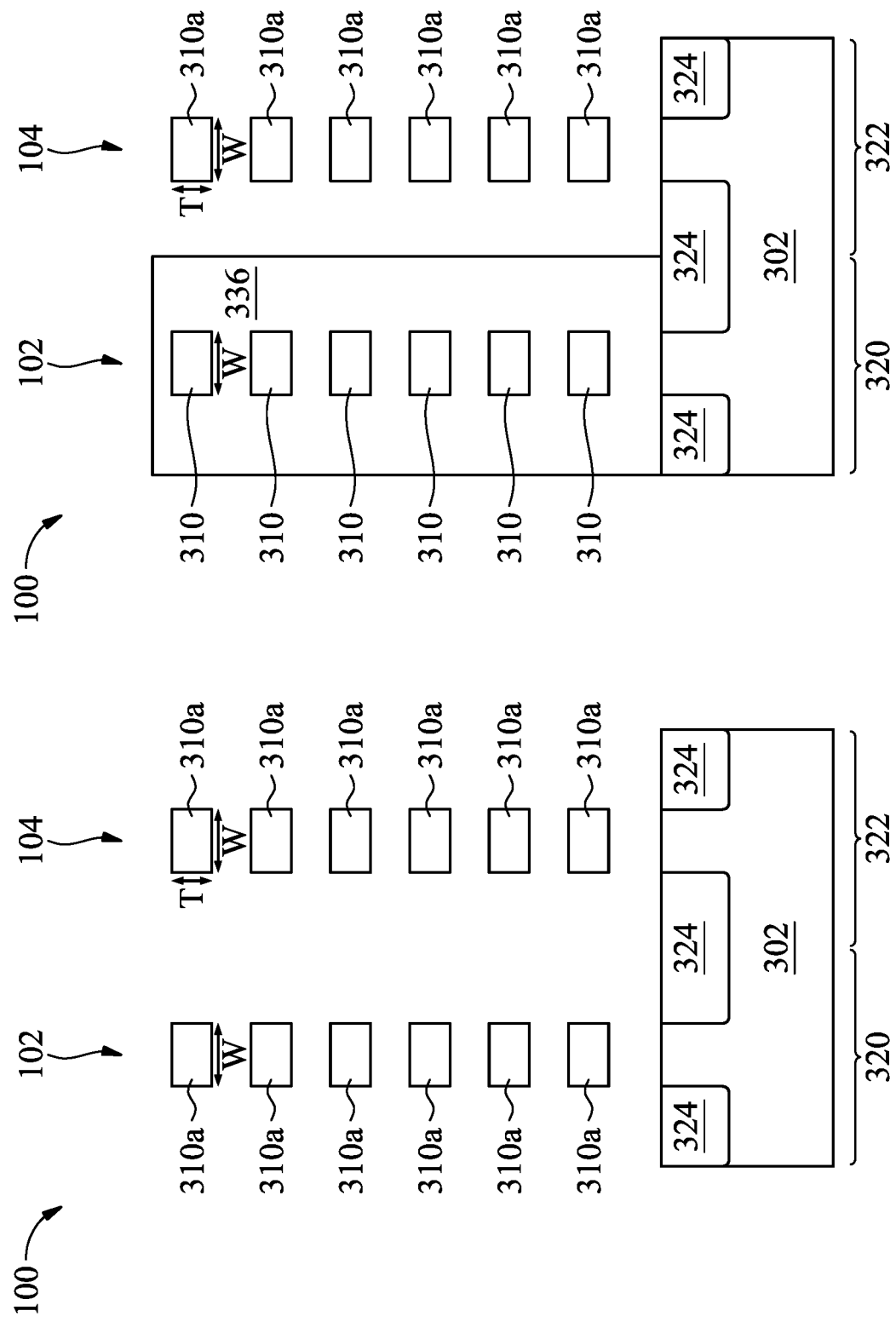

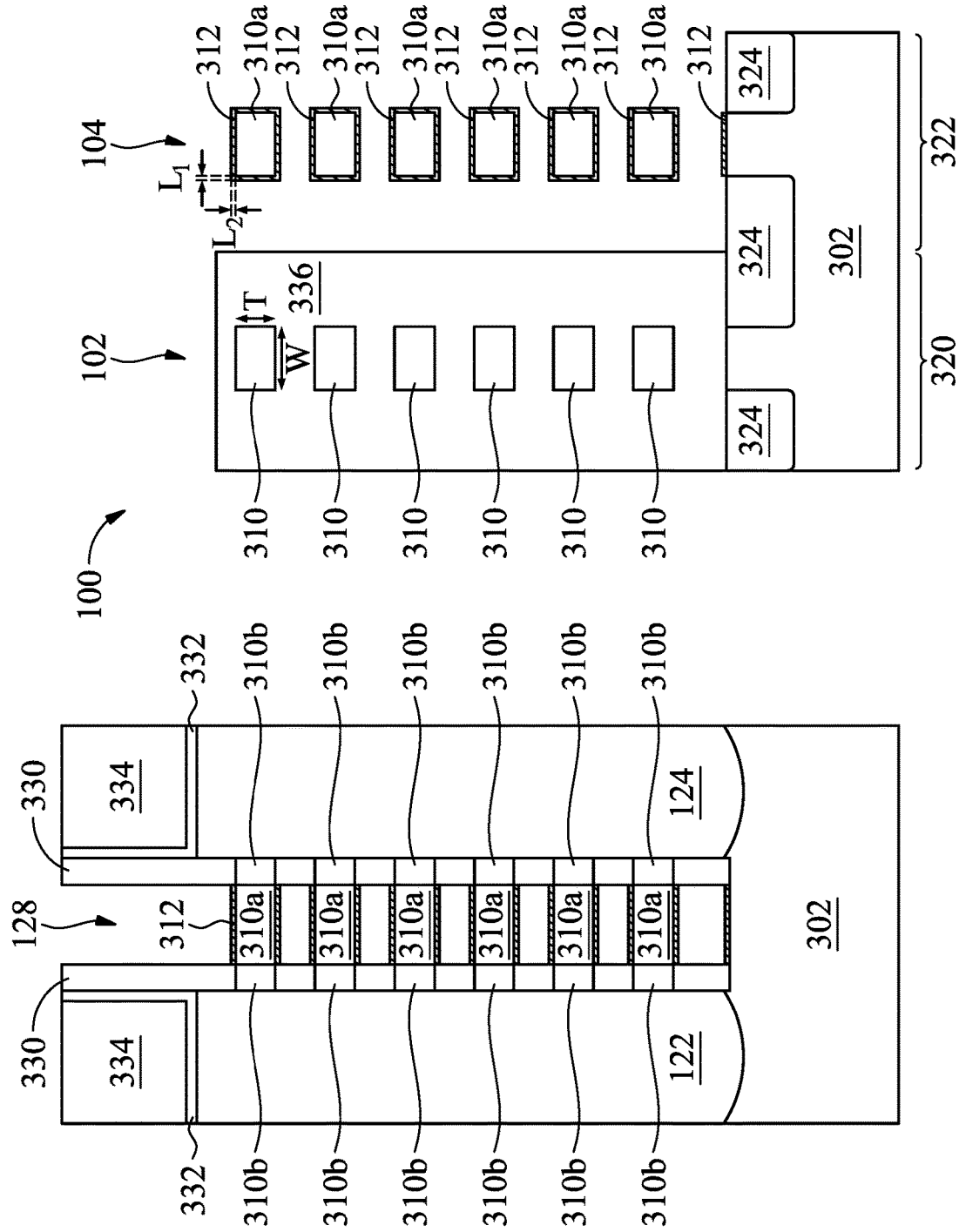

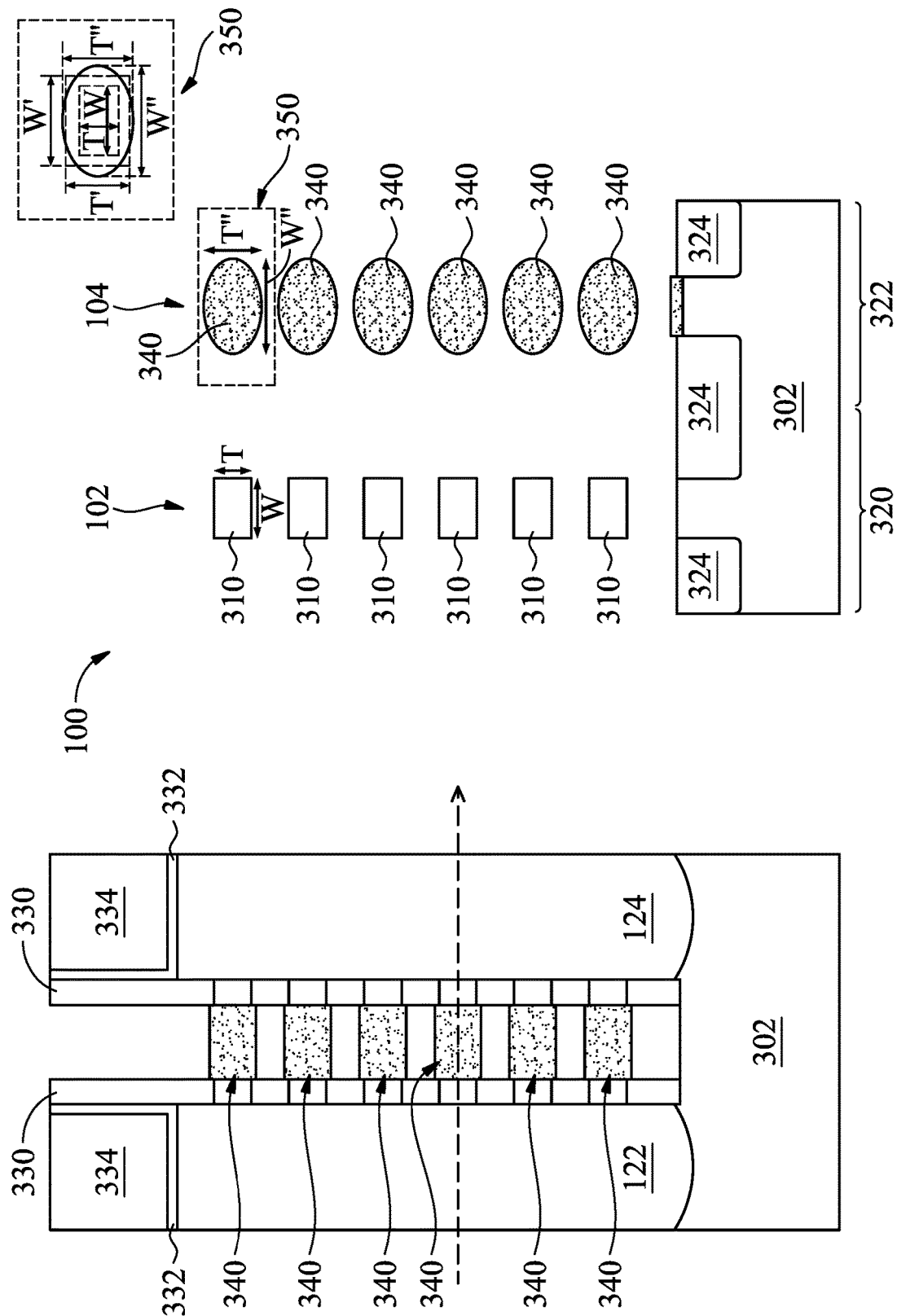

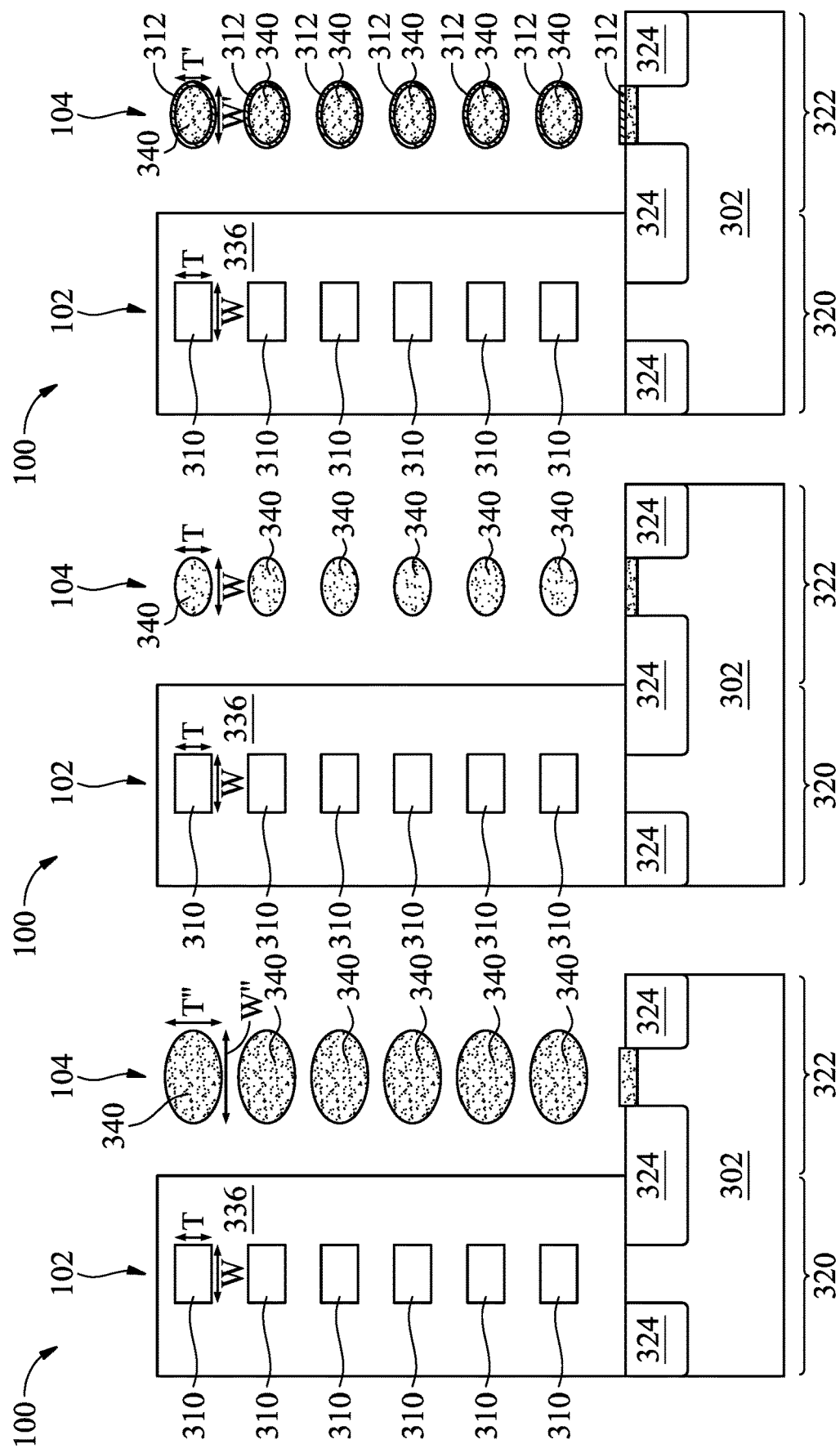

DUAL CHANNEL GATE ALL AROUND TRANSISTOR DEVICE AND FABRICATION METHODS THEREOF

PRIORITY

This application is a continuation of U.S. patent application Ser. No. 17/114,147 filed Dec. 7, 2020, which is a continuation in-part application of U.S. patent application Ser. No. 16/737,591 filed Jan. 8, 2020, which is a continuation of U.S. patent application Ser. No. 16/366,946 filed Mar. 27, 2019, which further claims priority to U.S. Provisional Patent Application Ser. No. 62/737,269 filed Sep. 27, 2018 and entitled "Dual Channel Gate All Around Transistor Device and Fabrication Methods Thereof," the entire disclosures of which are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced by increasing gate-channel coupling as an effort to improve gate control, reduce off-state current, and reduce short-channel effects (SCEs). One such multi-gate device is gate-all-around (GAA) transistor, whose gate structure wraps around its horizontal channel region providing access to the channel region on all four sides. GAA transistors are compatible with conventional complementary metal-oxide-semiconductor (CMOS) processes, allowing them to be aggressively scaled down while maintaining gate control and mitigating SCEs. However, fabrication of GAA transistors can be challenging as device sizes shrink. For example, current methods—which use separate epitaxial growth and separate patterning of stacked semiconductor layers to realize GAA transistors that have n-type and p-type dual channels—are not satisfactory in all respects, especially when the device pitch is small, such as 40 nanometers (nm) or smaller.

BRIEF DESCRIPTION OF THE DRAWINGS

Aspects of the present disclosure are best understood from the following detailed description when read with the accompanying figures. It is emphasized that, according to the standard practice in the industry, various features are not drawn to scale. In fact, the dimensions of the various features may be arbitrarily increased or reduced for clarity of discussion.

FIGS. 3, 4, 5, 6, 7, 8A, 8B, 9A, 9B, 10A, 10B, 11A, 11B, 12A, 12B, 13, 14, 15A, 15B, 16A, 16B, and 17 are cross-sectional views of a semiconductor device, at various fabrication stages, constructed according to the method in FIG. 2, according to some embodiments.

FIGS. 19A, 19B, and 19C are cross-sectional views of a semiconductor device, at various fabrication stages, constructed according to the method in FIG. 18, according to some embodiments.

DETAILED DESCRIPTION

Figure 1A:
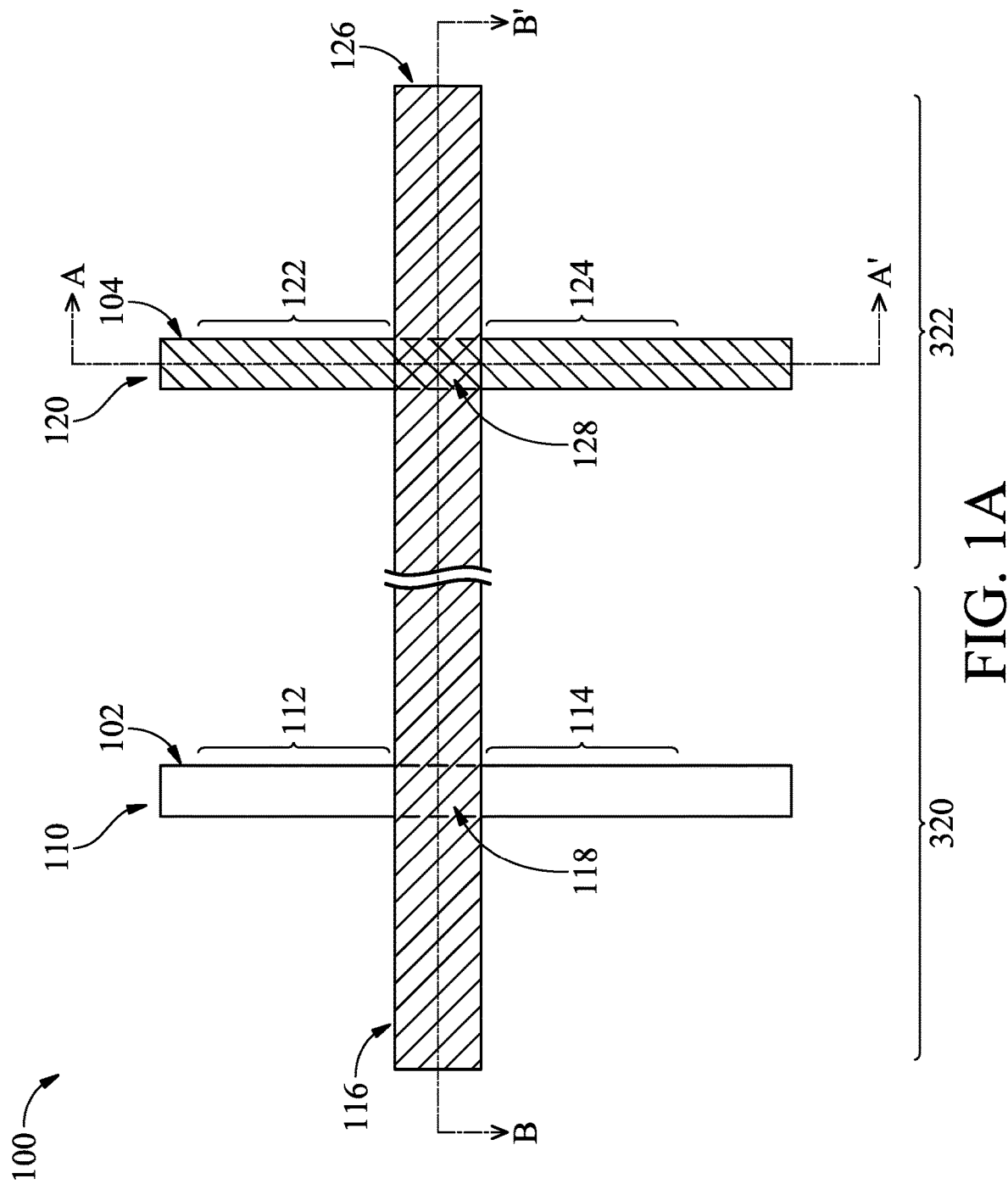
FIGS. 1A and 1B are top and perspective views, respectively, of a semiconductor structure formed according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to dual channel gate all around transistor device and fabrication methods thereof.

Presented herein are embodiments of a type of multi-gate transistor referred to as a gate-all-around (GAA) device. A GAA device includes any device that has its gate structure, or portion thereof, formed on four sides of a channel region (e.g., surrounding a portion of a channel region). GAA devices may be used to realize n-type and p-type transistors, often called dual channel transistors, which have vertically stacked n-type channels and p-type channels located on two close fins. GAA dual channel transistors are useful in many integrated circuits (ICs), but some methods of fabrication suffer from various problems. For instance, some methods require separate epitaxial growth and separate patterning of stacked semiconductor layers to realize GAA dual channel transistors. However, such an approach often increases the difficulty of processes (e.g., difficult to use an etchant to remove n-type semiconductor layers and to use another etchant to remove p-type semiconductor layers in the same device) and leads to defects.

The present disclosure addresses the above problems by providing improved methods of forming dual channel GAA field effect transistors (FETs) on multiple fins. According to some embodiments, after growing a stack of alternating first semiconductor layers (e.g., silicon) and second semiconductor layers (e.g., silicon germanium), a method directly patterns the stack to create first and second fins, and then removes the second semiconductor layers to create suspended nanostructures (e.g., nanowires or nanosheets) on both fins. The method avoids various steps such as blocking and etching the first stack, growth of a second stack of n-type and p-type semiconductor layers that alternate differently from the first stack, and removing the n-type semiconductor layers (while retaining p-type layers) from the second stack. Instead, to construct a p-type FinFET on the second fin, a method converts the suspended p-type nanostructures of the second fin to p-type nanostructures by growing thin p-type semiconductor layers (e.g., silicon germanium) that wrap around the suspended p-type nanostructures and then performing an anneal process to drive germanium into the suspended p-type nanostructures. In an example, germanium atoms are driven from a silicon germanium layer into an n-type channel made of silicon. The driven-in germanium forms distinctive distribution within the channel (e.g., distributed in the middle section of the channel but not in end sections of the channel). As a result, dual channel GAA FETs can be achieved with a simplified fabrication process.

It should be understood at the outset that the channel region of a GAA device may include nanowire channels, bar-shaped channels, and/or other suitable channel configurations. In some embodiments, the channel region of a GAA device has multiple horizontal nanowires, nanosheets, and/or nanobars vertically spaced, making the GAA device a stacked horizontal GAA device. The GAA devices presented herein include p-type metal-oxide-semiconductor GAA devices or n-type metal-oxide-semiconductor GAA devices. Further, the GAA devices have one or more channels (e.g., nanowires) associated with a single, contiguous gate structure, or multiple gate structures. One of ordinary skill may recognize other examples of semiconductor devices that may benefit from aspects of the present disclosure.

Figure 1B:
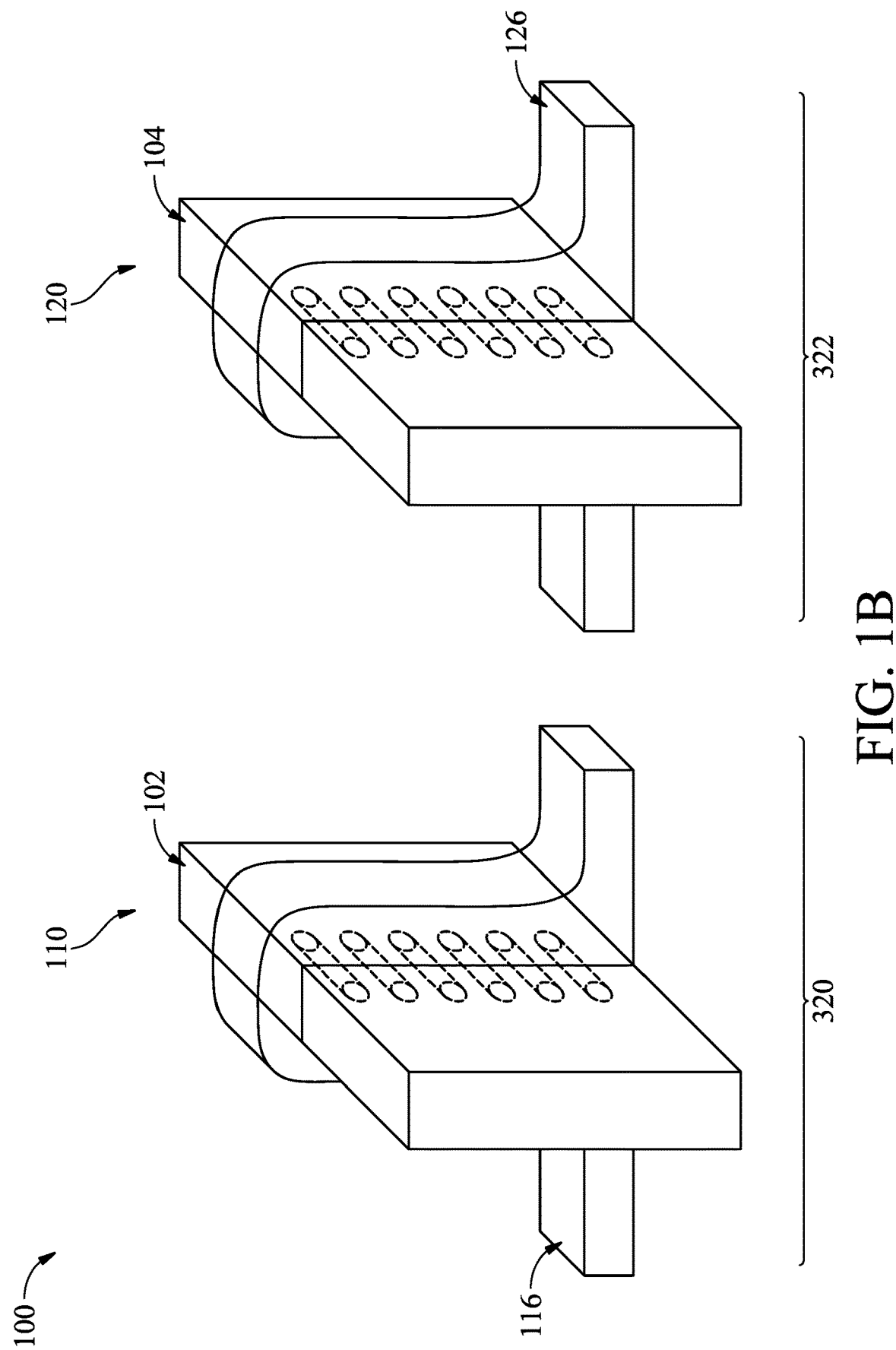

FIGS. 1A and 1B are top and perspective views, respectively, of a semiconductor structure 100 that is formed using embodiments disclosed herein. As illustrated in FIGS. 1A and 1B, the semiconductor structure 100 includes two fins 102 and 104, and an example n-type FET 110 and an example p-type FET 120 are formed on the fins 102 and 104, respectively. Specifically, the n-type FET 110 includes source/drain (S/D) regions 112 and 114 as well as a gate stack 116 interposed between the S/D regions 112 and 114. Similarly, the p-type FET 120 includes S/D regions 122 and 124, and a gate stack 126 interposed between the S/D regions 122 and 124. One or more FETs may be formed on each fin feature. The channel region for each FET, which underlies the gate, is the portion of the corresponding fin interposed between the source and drain regions. In the present embodiment, the n-type FET 110 has a first channel region 118 in the fin 102, and the p-type FET 120 has a second channel region 128 in the fin 104. As shown in FIG. 1A, the channel regions 118 and 128 each comprise nanowire or bar-shaped channels for current conduction, which are wrapped around by the gate stack 126. For the n-type FET 110, current carriers (electrons) flow through the channel region 118 along stacked silicon nanowire or bar-shaped channels (e.g., Si layers), which are considered n-type channels herein. For the p-type FET 120, current carriers (holes) flow through the channel region 128 along silicon germanium nanowire or bar-shaped channels (e.g., $Si_{1-y}Ge_y$ layers), which are considered p-type channels herein. By providing the semiconductor structure 100 having n-type FETs and p-type FETs with respective channel material compositions, the carrier mobility for both are enhanced and device performance is improved.

Figure 2:
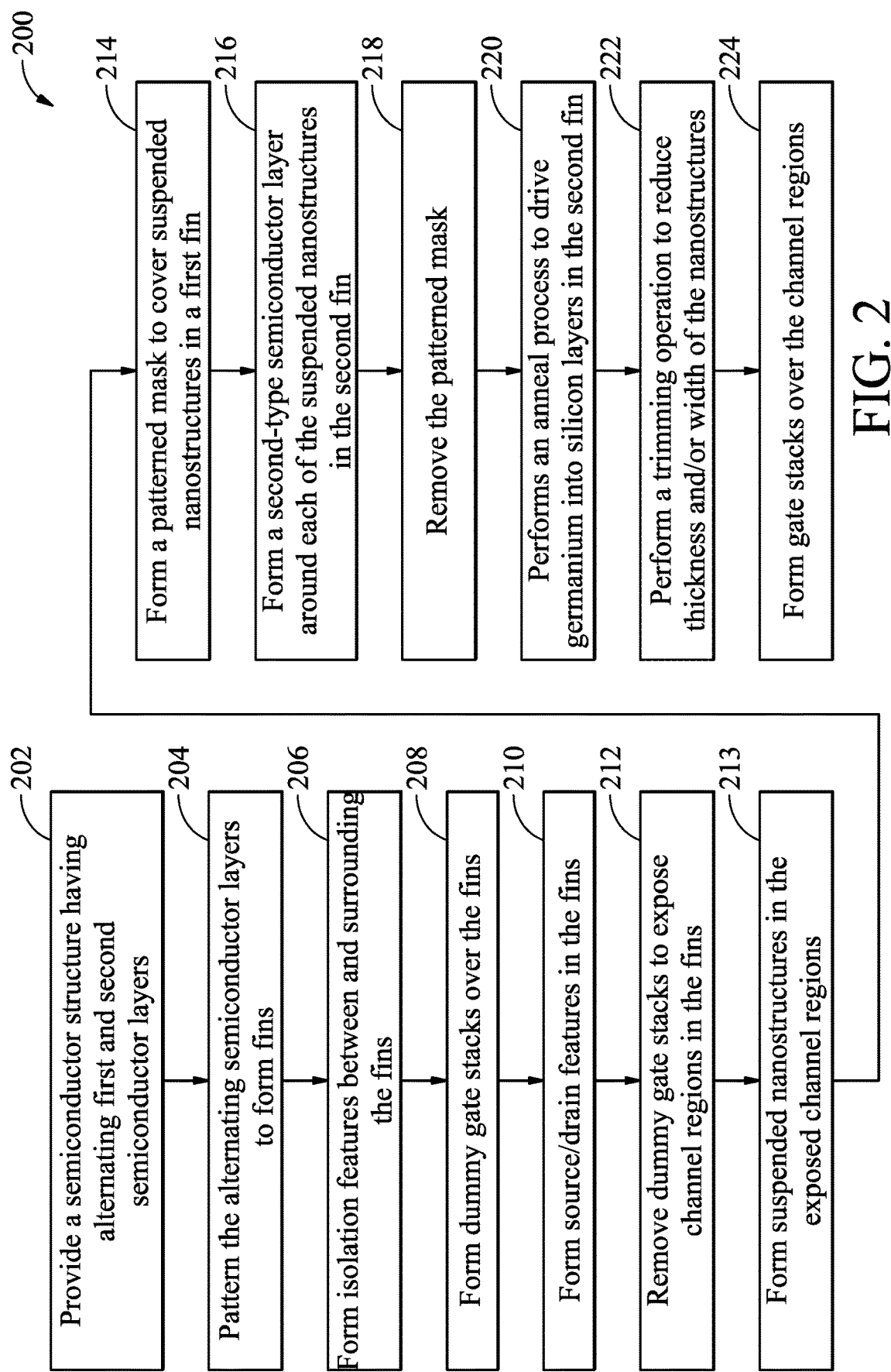
FIG. 2 is a flowchart of a method of forming a semiconductor device according to various aspects of the present disclosure.

FIG. 2 is a flowchart of a method 200 of forming the semiconductor device structure 100, according to various aspects of the present disclosure. The method 200 is merely an example and is not intended to limit the present disclosure beyond what is explicitly recited in the claims. Additional operations can be provided before, during, and after the method 200, and some operations described can be replaced, eliminated, or moved around for additional embodiments of the method. Some embodiments of method 200 are described below in conjunction with FIGS. 1 and 3-12B and the semiconductor structure 100. FIGS. 8A, 9A, 10A, and 11A are X-cut cross-sectional views of the semiconductor structure 100 (taken along the line A-A' in FIG. 1A) at intermediate operations of the method 200, and FIGS. 3-7, 8B, 9B, 10B, and 11B are Y-cut cross-sectional views of the semiconductor structure 100 (taken along the line B-B' in FIG. 1A) at intermediate operations of the method 200. FIGS. 15A and 16A are X-cut cross-sectional views of the semiconductor structure 100 (taken along the line A-A' in FIG. 1A) in some other embodiments at intermediate operations of the method 200, and FIGS. 13, 14, 15B, and 16B are Y-cut cross-sectional views of the semiconductor structure 100 (taken along the line B-B' in FIG. 1A) in some other embodiments at intermediate operations of the method 200.

In FinFET devices, fins extend in a first direction called an X-cut direction, and metal gates extend in a second direction called a Y-cut direction. Thus, the Y-cut cross-sectional views run in parallel with a length direction of the metal gates and perpendicular to a length direction of the fins.

At operation 202, the method 200 (FIG. 2) provides a starting semiconductor structure 100. In an embodiment, the semiconductor structure 100 includes a substrate 302 and a stack of alternatingly disposed semiconductor layers 308 and 310 (FIG. 3). The semiconductor structure 100 is provided for illustration purposes and does not necessarily limit the embodiments of the present disclosure to any number of devices, any number of regions, or any configuration of structures or regions. Furthermore, the semiconductor structures as shown in FIGS. 3-12B are intermediate devices fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 3, the substrate 302 may be a semiconductor substrate such as a silicon substrate. In some embodiments, the substrate 302 includes various layers, including conductive or insulating layers formed on a semiconductor substrate. The substrate 302 may include various doping configurations. For example, different doping profiles (e.g., n wells, p wells) may be formed on the substrate 302 in regions designed for different device types (e.g., n-type field effect transistors (NFET), p-type field effect transistors (PFET)). In some embodiments, the substrate 302 includes other semiconductors such as germanium, silicon carbide (SiC), silicon germanium (SiGe), or diamond. Alternatively, the substrate 302 includes a compound semiconductor and/or an alloy semiconductor. Further, the substrate 302 may optionally include an epitaxial layer, may be strained for performance enhancement, may include a silicon-on-insulator structure, and/or have other suitable enhancement features.

Still referring to FIG. 3, the semiconductor structure 100 includes a stack of semiconductor layers 308 and 310 in an interleaving or alternating fashion (e.g., a semiconductor layer 310 disposed over a semiconductor layer 308, then another semiconductor layer 308 disposed over the semiconductor layer 310, and so on). In some embodiments, the semiconductor layers 308 and 310 are alternatingly disposed in a vertical direction, forming a semiconductor stack. In various embodiments, the stack includes any number of alternately disposed semiconductor layers 308 and 310. In some embodiments, the semiconductor layers 308 and 310 have different thicknesses. Further, the semiconductor layers 308 may have different thicknesses from one layer to another layer, and the semiconductor layers 310 may have different thicknesses from one layer to another layer. In some embodiments, the thickness of each of the semiconductor layers 308 and 310 ranges from several nanometers to tens of nanometers. In an embodiment, each semiconductor layer 308 has a thickness ranging from about 5 nm to about 10 nm, and each semiconductor layer 310 has a thickness ranging from about 5 nm to about 10 nm. Note that, although FIG. 2 illustrates a semiconductor layer 308 as the bottom layer of the stack, a semiconductor layer 310 may be the bottom layer as well. The first layer of the stack may be thicker than other semiconductor layers 308 and 310.

The two types of semiconductor layers 308 and 310 have different compositions. In various embodiments, the semiconductor layers 308 have compositions that provide for different oxidation rates and/or different etch selectivity from the semiconductor layers 310. In an embodiment, the semiconductor layers 308 include silicon germanium ($Si_{1-x}Ge_x$), while the semiconductor layers 310 include silicon (Si). In an embodiment, each semiconductor layer 310 is silicon undoped or substantially dopant-free (i.e., having an extrinsic dopant concentration from about 0 $cm^{-3}$ to about $1 \times 10^{17}$ $cm^{-3}$), where no intentional doping is performed when forming the semiconductor layer 310 (e.g., of silicon). Alternatively, each semiconductor layer 310 is intentionally doped. In an example, the semiconductor layer 310 is made of silicon doped with either a p-type dopant such as boron (B), aluminum (Al), indium (In), and gallium (Ga), or an n-type dopant such as phosphorus (P), arsenic (As), antimony (Sb). In some embodiments, each semiconductor layer 308 is $Si_{1-x}Ge_x$ that includes less than 50% (x<0.5) Ge in molar ratio. For example, Ge comprises about 15% to about 35% of the semiconductor layer 308 of $Si_{1-x}Ge_x$ in molar ratio. Further, the semiconductor layers 308 may include different compositions among them, and the semiconductor layers 310 may include different compositions among them.

In various embodiments, either of the semiconductor layers 308 and 310 includes other materials such as a compound semiconductor (e.g., silicon carbide, gallium arsenide, gallium phosphide, indium phosphide, indium arsenide, and/or indium antimonide), or an alloy semiconductor (e.g., GaAsP, AlInAs, AlGaAs, InGaAs, GaInP, and/or GaInAsP), or combinations thereof. The materials of the semiconductor layers 308 and 310 may be chosen based on providing differing oxidation rates and/or etch selectivity. The semiconductor layers 308 and 310 may be doped or undoped, as discussed above.

In some embodiments, the semiconductor layers 308 and 310 are epitaxially grown layer-by-layer from a top surface of the substrate 302. In an example, each of the semiconductor layers 308 and 310 are grown by a molecular beam epitaxy (MBE) process, a chemical vapor deposition (CVD) process such as a metal organic CVD (MOCVD) process, and/or other suitable epitaxial growth processes. During the epitaxial growth, the crystalline structure of the substrate 302 extends upwardly, resulting in the semiconductor layers 308 and 310 having the same crystal orientation with the substrate 302.

At operation 204, the method 200 (FIG. 2) patterns the alternating semiconductor layers 308 and 310 to form one or more fins extending from the substrate 302. Referring to the example of FIG. 4, the semiconductor structure 100 includes a fin 102 in a first region 320 and a fin 104 in a second region 322. The fins 102 and 104 each include a stack of the semiconductor layers 308 and 310. Although two fins are illustrated for illustration, any suitable number of fins may be formed. The two fins 102 and 104 are spaced by a distance annotated as spacing S. In some embodiments, the spacing S is in a range from about 40 nm to about 100 nm. In furtherance of some embodiments, the spacing S is in a range from about 15 nm to about 40 nm, for tight device integration. In an embodiment, the first region 320 is a region of the substrate 302 defined for one or more n-type FETs and the second region 322 is a region of the substrate 302 defined for one or more p-type FETs. Note that the semiconductor structure 100 may alternatively have a p-type FET form in the region 320 and an n-type FET to form in the region 322.

The operation 204 includes a variety of processes such as photolithography and etching. In an embodiment, the operation 204 first forms a masking element over the semiconductor structure 100 through a photolithography process. The photolithography process may include forming a photoresist (or resist) over the semiconductor structure 100, exposing the resist to a pattern that defines various geometrical shapes, performing post-exposure bake processes, and developing the resist to form the masking element. Subsequently, the operation 204 etches the semiconductor layers 308 and 310 in the regions 320 and 322 through the masking element to form trenches 323 therein. The etching processes may include one or more dry etching processes, wet etching processes, and other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In an example, a wet etching process includes etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants. After etching, the remaining portions of the semiconductor layers 308 and 310 become the fins 102 and 104, defining the trenches 323 between and surrounding the fins 102 and 104. The etching process may further recess into the substrate 302. In some embodiments, the etching process is designed to over-etch into the substrate 302 to ensure that the substrate 302 is exposed throughout the trenches 323.

In an embodiment, the fins 102 and 104 are formed simultaneously using the same pattering steps (instead of being formed sequentially one after another using separate patterning steps). For example, the same photolithography and etching processes are used to form the fins 102 and 104, on which n-type and p-type dual channel GAA transistors may then be formed. Such a simple patterning approach provides advantages over other methods that use separate epitaxial growth and separate patterning of stacked semiconductor materials to realize dual channel use separate epitaxial growth and separate patterning of stacked semiconductor materials to realize GAA transistors.

At operation 206, the method 200 (FIG. 2) forms isolation features 324 between and surrounding the fins 102 and 104. Referring to FIG. 5, the isolation features 324 is formed of silicon oxide, silicon nitride, silicon oxynitride, fluoride-doped silicate glass, a low-k dielectric material, and/or other suitable insulating material. In some embodiments, the isolation features 324 are shallow trench isolation (STI) features. The operation 206 includes a variety of processes such as deposition and etching. In some embodiments, the operation 206 of the method 200 deposits a dielectric material, such as silicon oxide, into the trenches 323. The dielectric material is formed by chemical vapor deposition (CVD), plasma enhanced CVD (PECVD), physical vapor deposition (PVD), thermal oxidation, or other techniques. In some embodiments, a CMP process is performed to planarize a top surface of the semiconductor structure 100. Thereafter, the dielectric material is recessed by selective etching to form the isolation features 324, which isolates various portions of the substrate 302 and/or epitaxial stacks 308/310. The selective etching may include wet etching and/or dry etching to selectively etch back the isolation features 324.

The method 200 then proceeds to forming FETs on the fins 102 and 104. In an example, the method 200 forms the n-type FET 110 on the fin 102 within the first region 320 and the p-type FET 120 on the fin 104 within the second region 322. Forming the FETs includes various procedures and operations, which are described next.

At operation 208, the method 200 forms dummy gate stacks over the fins 102 and 104, respectively. In an embodiment, the dummy gate stacks will be removed in a later gate-replacement process. The dummy gate stacks engage the fins 102 and 104 at the channel regions 118 and 128. The dummy gate stack includes one or more material layers. In the present embodiment, the dummy gate stacks include a polysilicon (or poly) layer. In an embodiment, the dummy gate stacks further include an interfacial layer (e.g., silicon oxide) underneath the poly layer. The poly layer is formed by suitable deposition processes such as low-pressure chemical vapor deposition (LPCVD) and PECVD. In an embodiment, the material layers of the dummy gate stack are first deposited as blanket layers, and then patterned with one or more photolithography and etching processes to form the dummy gate stacks.

Gate spacers (e.g., gate spacers 330 shown in FIG. 8A) are formed on sidewalls on the dummy gate stacks after the dummy gate stacks are patterned. The gate spacer includes one or more dielectric materials such as silicon nitride, silicon oxide, silicon carbide, silicon oxycarbide (SiOC), silicon oxycarbon nitride (SiOCN), other suitable low-k dielectric materials, or combinations thereof. In some embodiments, the gate spacer is formed by depositing a spacer layer blanketing the semiconductor structure 100 with suitable methods, such as chemical oxidation, thermal oxidation, ALD, or CVD, then etching the spacer layer by an anisotropic etching process to remove portions of the spacer layer from a top surface of the dummy gate stacks and from top and sidewall surfaces of the fins (e.g., fins 102 and 104). Portions of the spacer layer on the sidewall surfaces of the dummy gate stacks substantially remain and become the gate spacer. In an embodiment, the anisotropic etching process is a dry (e.g., plasma) etching process.

At operation 210, the method 200 forms source/drain (S/D) features in the S/D regions 112 and 114 of the n-type FET 110 and the S/D regions 122 and 124 of the p-type FET 120. In an embodiment, forming the S/D features includes epitaxially growing a semiconductor layer by an MBE process, a chemical vapor deposition process, and/or other suitable epitaxial growth processes. In a further embodiment, the S/D features are in-situ or ex-situ doped with an n-type dopant or a p-type dopant. For example, in some embodiments, the S/D features includes silicon-germanium (SiGe) doped with boron for forming S/D features for a p-type FET. In some embodiments, the S/D features include silicon doped with phosphorous for forming S/D features for an n-type FET.

At operation 212, the dummy gate stacks are removed to expose channel regions, such as the channel region 118 of the fin 102 and the channel region 128 of the fin 104. The dummy gate stacks, which include the poly layer and any other layers thereunder, are removed to form respective openings. In an embodiment, removing the dummy gate stack includes one or more etching processes, such as wet etching and/or dry etching.

At operation 213, the method 200 forms suspended nanostructures (nanowire or nanosheet) in the exposed channel regions. The formation of suspended nanostructures includes a selective etching process to selectively remove one semiconductor layer from the respective channel region (or channel and source/drain regions) of the FETs. Referring to the example of FIG. 6, the semiconductor layers 308 (e.g., $Si_{1-x}Ge_x$) are removed from the channel regions of the fins 102 and 810 while the semiconductor layers 310 (e.g., Si) substantially remain as the channels. In other words, in the channel regions 118 and 128, the semiconductor layers 308 (or portions thereof) are removed. As a result, portions of the semiconductor layers 310 in the channel regions 118 and 128 are suspended in the respective openings. Therefore, after operation 213, the semiconductor layers 310 (and layers converted from the semiconductor layers 310) are also called suspended nanostructures in the channel regions 118 and 128.

In an embodiment, the semiconductor layers to be removed are etched by a selective wet etching process while the other semiconductor layers with different composition remain substantially unchanged. In some embodiments, the selective wet etching process includes a hydro fluoride (HF) or NH$_4$OH etchant. In an embodiment where the semiconductor layers 308 includes SiGe and the semiconductor layers 310 includes Si, the selective removal of the SiGe layers 308 includes a SiGe oxidation process followed by a SiGeO$_x$ removal. In an example, the SiGe oxidation process includes forming and patterning various masking layers such that the oxidation is controlled to the SiGe layers 308. In other embodiments, the SiGe oxidation process is a selective oxidation due to the different compositions of the semiconductor layers 308 and 310. In some examples, the SiGe oxidation process is performed by exposing the semiconductor structure 100 to a wet oxidation process, a dry oxidation process, or a combination thereof. Thereafter, the oxidized semiconductor layers 308, which include SiGeO$_x$, are removed by an etchant such as NH$_4$OH or diluted HF. The semiconductor layer can be also removed by a selective dry etching process while other semiconductor layers with different composition remain substantially unchanged. In some embodiments, the selective dry etching process includes a hydro fluoride (HF), fluoride (F$_2$), Carbon fluoride (CF$_x$), hydrogen (H$_2$)-based etchant.

In the Y-cut view of FIG. 6, the remaining semiconductor layers 310 are illustrated as having oval shapes (due to partial etching of the semiconductor layers 310), but it is understood that the semiconductor layers 310 may be bar-shaped, or rectangle-shaped (nanosheet), or any other suitable shape in this view, such as an alternative embodiment illustrated in FIG. 13, which will be further discussed below. In some embodiments, each remaining layer 310 has a thickness (denoted as T in FIG. 6) of about 3 to about 8 nm, and each remaining layer 310 has a width (denoted as W in FIG. 6) of about 5 to about 30 nm.

To realize n-type and p-type dual channels, the method 200 then proceeds to converting the channel region 128 in the fin 104 from a first type to a second type (e.g., from n-type to p-type, or vice versa). In an example, the method 200 forms a first-type (e.g., n-type) channel region 118 in the fin 102 and a second-type (e.g., p-type) channel region 128 in the fin 104. The conversion of the channel region 128 includes various procedures and operations, such as operations 214, 216, and 218, which are described next.

Figure 7:
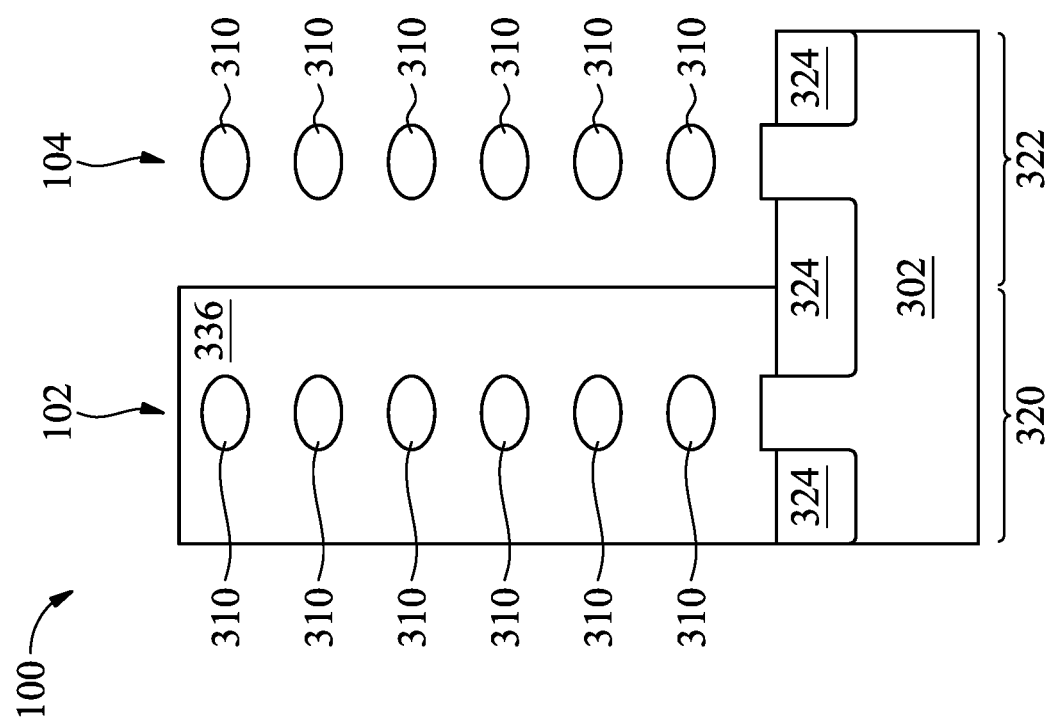

At operation 214, the method 200 (FIG. 2) forms a patterned mask on the top surface of the semiconductor structure 100. As shown in FIG. 7, the patterned mask covers the fin 102 in the first region 320 and includes an opening that exposes the fin 104 in the second region 322 of the semiconductor structure 100. In one embodiment, the patterned mask includes a hard mask 336 (instead of a soft mask such as a patterned resist layer) disposed on the region 320. In some examples, the hard mask 336 includes silicon oxide, silicon nitride, silicon oxynitride, silicon carbide, silicon carbide nitride, silicon carbide oxynitride, other semiconductor material, and/or other dielectric material. In an embodiment, the hard mask 336 has a thickness ranging from about 1 nm to about 40 nm. The hard mask 336 is formed by thermal oxidation, chemical vapor deposition (CVD), atomic layer deposition (ALD), or any other appropriate method. The hard mask 336 is patterned using any suitable methods such as a photolithography process, which may include forming a resist layer on the hard mask 336, exposing the resist by a lithography exposure process, performing a post-exposure bake process, developing the photoresist layer to form the patterned photoresist layer that exposes part of the hard mask 336, patterning the hard mask 336, and finally removing the patterned resist layer. The lithography process may be alternatively replaced by other suitable techniques, such as e-beam writing, ion-beam writing, maskless patterning or molecular printing.

At operation 216, the method 200 forms a semiconductor layer 312 around each of the nanowire or bar-shaped layers 310 located in the fin 104 (but not those in the fin 102). Since semiconductor layers 312 are used to convert the channel region 128 in the fin 104 from a first-type (e.g., n-type) to a second-type (e.g., p-type), the semiconductor layer 312 have different compositions from the semiconductor layers 310. In various embodiments, the semiconductor layers 312 have compositions that provide for different oxidation rates and/or different etch selectivity from the semiconductor layers 310. In an embodiment, the semiconductor layers 312 include silicon germanium (Si$_{1-x}$Ge$_x$), while the semiconductor layers 310 include silicon (Si). In some embodiments, each layer 312 is Si$_{1-x}$Ge$_x$ that includes about 10% to about 100% (0.1≤x≤1) Ge in molar ratio. A sufficient amount of Ge in each layer 312 helps convert the channel region 128 in the fin 104 from a first-type (e.g., n-type) to a second-type (e.g., p-type). For example, Ge may comprise about 60% to about 80% of the layer 312 of Si$_{1-x}$Ge$_x$ in molar ratio. Such a range of Ge, combined with subsequent processing steps, effectively converts the channel region 128 from the first-type to the second-type. Further, the semiconductor layers 312 may include different compositions among them.

Figures 8A, 8B:
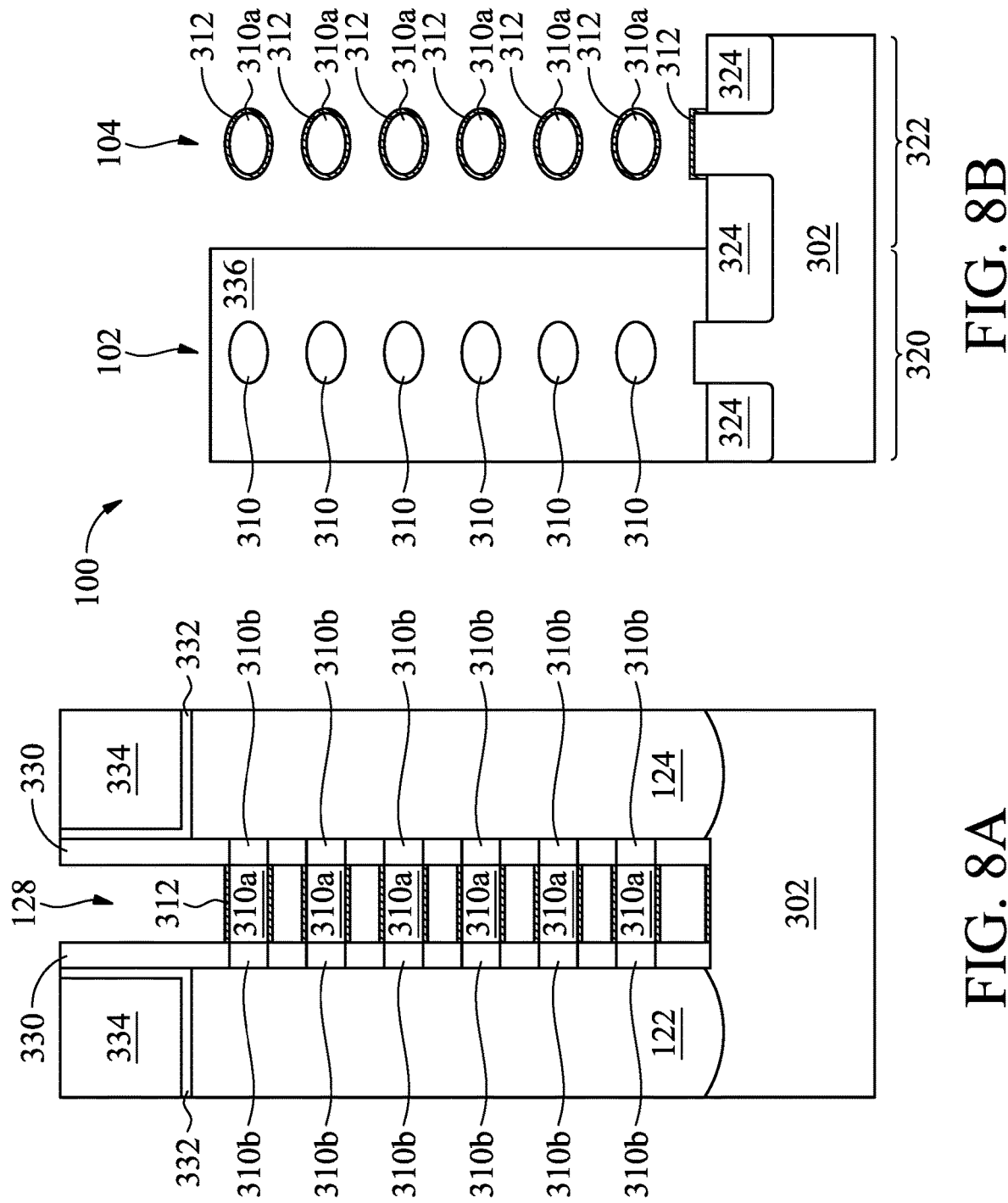

In some embodiments, the semiconductor layers 312 are epitaxially grown from the surfaces of the semiconductor layers 310. For example, each semiconductor layer 312 is grown by an MBE process, a CVD process such as a MOCVD process, and/or other suitable epitaxial growth processes. The epitaxial growth approach allows materials in the semiconductor layer 312 to form crystalline lattices that are consistent with those of the semiconductor layers 310. In some embodiments, each semiconductor layer 312 is a conformal layer that has a substantially uniform thickness. As shown in FIGS. 8A and 8B, each semiconductor layer 312 has a thickness of about 2 to about 5 nm. In some embodiments, a thickness ratio between a semiconductor layer 310 and its surrounding semiconductor layer 312 is about 2:1 to about 4:1. In other words, the semiconductor layer 312 is thinner than its corresponding semiconductor layer 310. Such a thickness ratio provides the suitable amount of germanium needed to convert the semiconductor layers 310 from n-type to p-type.

As shown in FIG. 8A, each semiconductor layer 310 includes a middle section 310a and two end sections 310b, where the middle section 310a is suspended in space (and to be wrapped around by the gate stack 126 in subsequent steps), and the end sections 310b are engaged (e.g., surrounded or wrapped around) by the gate spacers 330. In an embodiment, since only middle sections 310a are exposed, the semiconductor layers 312 are epitaxially grown only in the middle sections 310a, and not in the end sections 310b, of the suspended nanostructures. In other words, the semiconductor layers 312 are only formed at the gate contact region and stop at the gate spacers 330 (i.e., not extending horizontally into the gate spacers 330 or portions of the semiconductor layers 310 surrounded by the gate spacers 330).

Note that FIG. 8A shows other features that have been previously formed, including S/D regions 122 and 124, gate spacers 330, a contact etch stop layer (CESL) 332, and an interlayer dielectric (ILD) layer 334. The formation process of the S/D regions 122 and 124 and the gate spacers 330 have been described above. CESL 332 includes silicon nitride, silicon oxide, silicon oxynitride (SiON), and/or other suitable materials. CESL 332 is formed after dummy gate stacks, and CESL 332 is formed by one or more methods including PECVD, ALD, and/or other suitable methods. In some embodiments, ILD layer 334 is formed over CESL 332, and includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. ILD layer 334 is formed by FCVD, PECVD, or other suitable methods. Further, to tailor characteristics of the p-type transistor on the fin 104, in some embodiments, after operation 216 (FIGS. 8A and 8B), n-type dopants such as phosphorus (P), arsenic (As), antimony (Sb) may also be introduced into the semiconductor layers 312 and corresponding semiconductor layers 310.

Referring to FIGS. 1, 9A, and 9B, the method 200 at operation 218 removes the patterned mask (e.g., the hard mask 336) from the semiconductor structure 100. Any suitable removal processes including dry etching, wet etching, and/or reactive ion etching (RIE) may be used.

Referring to FIGS. 1, 10A, and 10B, the method 200 at operation 220 performs an anneal process to drive germanium contained in the semiconductor layers 312 into their corresponding semiconductor layers 310. The semiconductor structure 100 is exposed to a gas that contains nitrogen (N), phosphorus, or other suitable elements. To avoid oxidation of the semiconductor layers 312 (e.g., silicon germanium), in some embodiments, the gas contains no oxygen content. The conditions of the anneal process are adjusted to control the profile and characteristics of the resulting channel. In an example, the anneal process is performed at temperatures between about 700 degrees Celsius (° C.) to about 1200. The anneal process 410 may be performed for a relatively long period such as 10 seconds to 100 seconds (called "soaking") or a relatively short period such as hundreds of milliseconds to a few seconds (e.g., 200 milliseconds to 2 seconds) (called "spiking").

The anneal process causes germanium atoms, and possibly silicon atoms, contained in the semiconductor layers 312 to diffuse or migrate into the corresponding semiconductor layers 310. On the other hand, silicon atoms contained in the semiconductor layers 310 may also diffuse or migrate into the corresponding semiconductor layers 312. As a result of the migration of atoms, the semiconductor layers 312 decrease in germanium content, and the semiconductor layers 310 increase in germanium content. In an embodiment, after the anneal process, each of the semiconductor layers 312 is $Si_{1-x}Ge_x$ that includes more than 0% but equal to or less than about 70% ($0.1 < x \leq 0.7$) Ge in molar ratio. Such a range of Ge is a result of diluting the initial concentration of Ge in the layer 312 (e.g. about 10% to about 80%, as described above) and effectively converts the channel region 128 from a first-type (e.g., n-type) to a second-type (e.g., p-type). In an embodiment, the germanium content in the semiconductor layers 312 changes the semiconductor layers 310 from n-type to p-type. Each semiconductor layers 312 and its corresponding semiconductor layer 310 may effectively combine to form a new suspended channel 340, as the material compositions of the semiconductor layers 310 and 312 become the same or similar (e.g., when germanium gets uniformly distributed throughout the semiconductor layers 310 and 312).

Figures 11A, 11B:
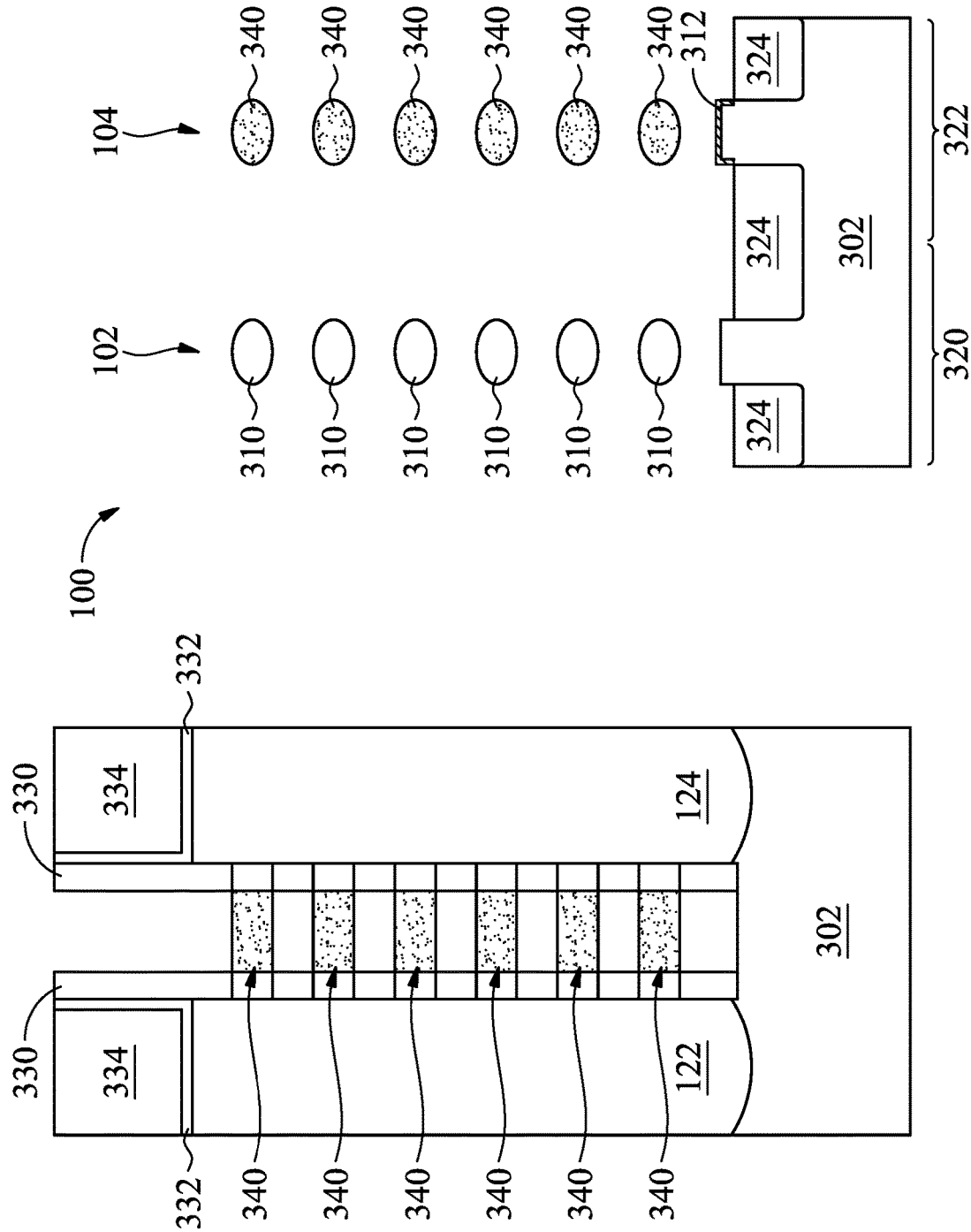

Since the suspended nanostructures 340 are formed as a combination of corresponding semiconductor layers 310 and 312, the suspended nanostructures 340 in the fin 104 may be thicker and wider than the suspended nanostructures 310 in the fin 102. Referring to FIGS. 1, 11A, and 11B, the method 200 at operation 222 optionally performs a trimming operation to reduce the thickness and/or width of the layers. The trimming operation uses any suitable etching process such as dry etching, wet etching, and/or RIE. In an embodiment, the suspended nanostructures 340 in the fin 104 are trimmed to have about the same dimensions (e.g., thickness and/or width) as the suspended nanostructures 310 in the fin 102.

According to some embodiments disclosed herein, the driven-in germanium atoms get distributed in the suspended nanostructures 340 in various ways, which may be tailored by controlling the conditions of the anneal process. As described above and shown in FIG. 8A, when the semiconductor layers 312 were epitaxially grown, they attached to the middle sections 310a of the suspended nanostructures. Thus, during the anneal process, germanium atoms in the semiconductor layers 312 may diffuse mostly into the middle sections 310a (and not the end sections 310b) of corresponding suspended nanostructures. FIG. 12A illustrates an example concentration profile of germanium in the X-cut direction (along the line taken in FIG. 11A). As shown in FIG. 12A, a concentration of germanium in the middle section of each channel 340 is higher than a concentration of the germanium in the two end sections of the channel 340. Any suitable methods of determining concentration may be used (e.g., by determining an average concentration or median concentration). In an embodiment, the concentration of the germanium in the middle section of each channel 340 is substantially uniform, while the concentration of the germanium in the end sections of each channel 340 takes a gradient profile (e.g., gradually decreasing from the high concentration in the middle section until the concentration becomes zero). Note that, due to the spreading nature of germanium migration in the anneal process, the concentration of germanium may start to decrease at points C and C' shown in FIG. 12A, which may be a few nanometers off from the interface between the middle section and an end section. In some embodiments (for example, when the anneal process has a short duration and/or low temperatures), germanium does not reach far enough under the gate spacers 330 to reach the source region 122 and the drain region 124. Instead, the concentration of germanium drops to zero at the points D and D' shown in FIG. 12A. Thus, at least a portion of the two end sections—which is in direct contact with the gate spacers 330, the source region 122, and the drain region 124—is substantially devoid of germanium. In an embodiment, the entire end sections of the channel 340 are substantially devoid of germanium.

Figure 12B:
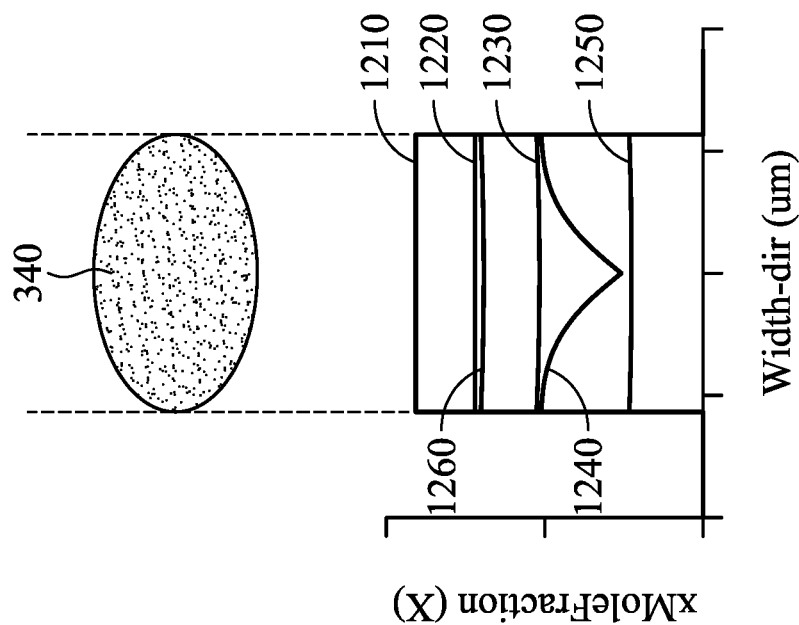
Figure 12A:
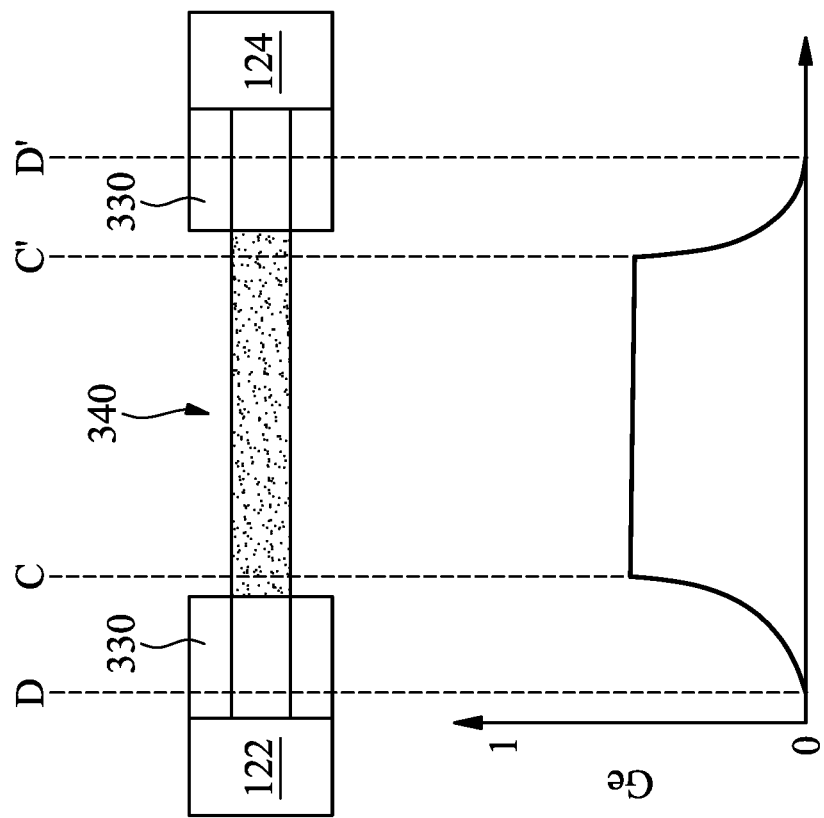

FIG. 12B illustrates an example simulated concentration profile of germanium in the Y-cut direction (along the line taken in FIG. 11B). As shown in FIG. 12B, a concentration of germanium in a core portion of each channel 340 may be equal to or lower than a concentration of germanium in an edge portion of the channel 340. Different concentration profiles may be realized by controlling various parameters such as the thickness of a semiconductor layer 312, the concentration of germanium in the semiconductor layer 312, and/or conditions of its anneal process. For example, a thicker semiconductor layer 312 supplies more germanium atoms, and a longer anneal process (or performed at higher temperatures) drives germanium further into a core of the channel 340, thereby leading to a more uniform concentration of germanium. FIG. 12B illustrates an example of how to control the concentration profile of the semiconductor layer 312.

In FIG. 12B, profiles 1210-1260 represent six different sets of parameters that illustrate how each specific set of parameters leads to a distinctive concentration profile of germanium in a semiconductor layer 312. Specifically, profile 1210 represents the case where the layer 312 is about 4.5 to about 5.5 nm thick, contains about 50% to about 60% of germanium, and is annealed at a spiking temperature of about 1200 to about 1300 Celsius. A uniform germanium concentration of about 34% to 38% is achieved in both the core portion and the edge portion of the channel 340. In profile 1220, the layer 312 is about 2.5 nm to about 3.5 thick, contains about the same concentration of germanium as in profile 1210, and is annealed at a spiking temperature of about 1030 to about 1070 Celsius. A germanium concentration of 26% to about 30% is achieved in the edge portion of the channel 340, and a slightly lower germanium concentration (about 1% lower) is achieved in the core portion of the channel 340. In profile 1230, the layer 312 is about 1.3 to about 1.7 nm thick, contains about the same concentration of germanium as in profile 1210/1220, and is annealed at a temperature of about 1030 to about 1070 Celsius for about 4 to about 6 seconds. A germanium concentration of about 18% to about 22% is achieved in the edge and core portions of the channel 340. In profile 1240, the layer 312 is about 1.3 to about 1.7 nm thick, contains about the same concentration of germanium as in profile 1210/1220/1230, and is annealed at about the same temperature as in profile 1220. The germanium concentration follows a gradient profile that decreases from a maximal concentration of about 18% to about 22% at the edge of the channel 340 to a minimal concentration of about 11% to about 13% at the core of the channel 340. In some embodiments, such a gradient profile is caused by the relatively short duration of the anneal process (e.g., insufficient time for germanium to migrate all the way to the core). In profile 1250, the layer 312 of about 1.3 to about 1.7 nm thick and containing about 23% to about 23% of germanium is annealed at a spiking temperature of about 1150 to about 1250 Celsius. A germanium concentration of about 9% to about 11% is achieved in the edge and core portions of the channel 340. Lastly, profile 1260 represents a reference case where a p-type channel made of SiGe contains about 26% to 30% of germanium in its edge and core portions. As illustrated in FIG. 12B, different distribution profiles of germanium are achieved by controlling one or more parameters including the thickness of a semiconductor layer 312, the concentration of germanium in the semiconductor layer 312, and/or conditions of its anneal process. Each specific set of parameters leads to a distinctive concentration profile of germanium in the layer 312.

In an embodiment, at operation 224 (FIG. 2), the method 200 continues to form the gate stacks 116 and 126 over the channel regions 118 and 128 of the fins 102 and 104, respectively. Referring to the example of FIG. 1A, the gate stacks 116 and 126 fill the openings in the channel regions and wrap around each of the exposed semiconductor layers (e.g., nanowires), such as the semiconductor layers 310 in the channel region 118 and the semiconductor layers 312 in the channel regions 128. The gate stacks 116 and 126 have similar structures but in some embodiments use different metals and/or different thicknesses of layers. In the present embodiment, the gate stacks include a dielectric layer which may include one or multiple layers of dielectric materials on interior surfaces of the opening and directly wrapping over each of the channel semiconductor layers. The dielectric layer includes a dielectric material such as silicon oxide or silicon oxynitride, and is formed by chemical oxidation, thermal oxidation, ALD, CVD, and/or other suitable methods. In some embodiments, the dielectric layer also includes a high-k dielectric layer such as hafnium oxide, zirconium oxide, lanthanum oxide, titanium oxide, yttrium oxide, strontium titanate, other suitable metal-oxides, or combinations thereof; and is formed by ALD and/or other suitable methods. The gate stacks further include a gate metal stack which may include one or multiple layers over the dielectric layer(s), and a metal fill layer over the gate metal stack. In some embodiments, the gate metal stack includes a work function metal layer, which is a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. In some embodiments, the p-type or n-type work function metal layer includes a plurality of layers deposited by CVD, PVD, and/or other suitable process. The metal fill layer includes aluminum, tungsten, cobalt, copper, and/or other suitable materials, and is formed by CVD, PVD, plating, and/or other suitable processes. In some embodiments, the gate stacks wrap around the vertically-stacked horizontally-oriented channel semiconductor layers. Hence, the semiconductor structure 100 is a stacked horizontal gate-all-around (S-HGAA) device. In an embodiment, after the gate stacks are deposited, a CMP process is performed to planarize a top surface of the semiconductor structure 100.

In various embodiments, the method 100 may optionally skip operation 222 without reducing thickness and/or width of the suspended nanostructures for p-type channels. Accordingly, a cross-sectional area of the suspended nano structures in the fin 104 may be larger than that in the fin 102. Since p-type channel relies on holes for conduction, which has slower mobility than electrons in n-type channel, a larger cross-sectional area in p-type channel helps increasing channel effective width and thus higher current and better transistor performance.

Referring back to operation 213 of the method 200 (FIG. 2), yet another embodiment of the semiconductor structure 100 after the formation of suspended nanostructures is illustrated in FIG. 13. In the Y-cut view of FIG. 13, the remaining semiconductor layers 310 are illustrated as having rectangle-shaped (may have rounded corners due to partial etching of the semiconductor layers 310, which are not shown), but it is understood that the semiconductor layers 310 may have oval shapes as already discussed above in association with FIG. 6, or any other suitable shape in this view. In some embodiments, each remaining layer 310 in either the fin 102 or 104 has substantially the same dimensions, such as a thickness (denoted as T in FIG. 13) of about 3 to about 8 nm and a width (denoted as W in FIG. 13) of about 5 to about 30 nm, and accordingly substantially the same cross-sectional area.

At operation 214, the method 200 (FIG. 2) forms a patterned mask on the top surface of the semiconductor structure 100. As shown in FIG. 14, the patterned mask covers the fin 102 in the first region 320 and includes an opening that exposes the fin 104 in the second region 322 of the semiconductor structure 100. In one embodiment, the patterned mask includes a hard mask 336 (instead of a soft mask such as a patterned resist layer) disposed on the region 320. In an embodiment, the hard mask 336 has a thickness ranging from about 1 nm to about 40 nm. The hard mask 336 is patterned using any suitable methods such as a photolithography process. The lithography process may be alternatively replaced by other suitable techniques, such as e-beam writing, ion-beam writing, maskless patterning or molecular printing.

At operation 216, the method 200 forms a semiconductor layer 312 around each of the semiconductor layers 310 located in the fin 104 (but not those in the fin 102). The semiconductor layer 312 also covers a top surface of the substrate 302 directly under the bottommost semiconductor layer 310 in the fin 104. Since semiconductor layers 312 are used to convert the channel region 128 in the fin 104 from a first-type (e.g., n-type) to a second-type (e.g., p-type), the semiconductor layer 312 have different compositions from the semiconductor layers 310. In various embodiments, the semiconductor layers 312 have compositions that provide for different oxidation rates and/or different etch selectivity from the semiconductor layers 310. In an embodiment, the semiconductor layers 312 include silicon germanium ($Si_{1-x}Ge_x$), while the semiconductor layers 310 include silicon (Si). In some embodiments, each layer 312 is $Si_{1-x}Ge_x$ that includes about 10% to about 100% ($0.1 \le x \le 1$) Ge in molar ratio. In a particular example, each layer 312 is $Si_{1-x}Ge_x$ that includes no less than 25% Ge ($0.25 \le x \le 1$) in molar ratio. A sufficient amount of Ge in each layer 312 helps convert the channel region 128 in the fin 104 from a first-type (e.g., n-type) to a second-type (e.g., p-type).

In some embodiments, the semiconductor layers 312 are epitaxially grown from the surfaces of the semiconductor layers 310. For example, each semiconductor layer 312 is grown by an MBE process, a CVD process such as a MOCVD process, and/or other suitable epitaxial growth processes. The epitaxial growth approach allows materials in the semiconductor layer 312 to form crystalline lattices that are consistent with those of the semiconductor layers 310. In some embodiments, the semiconductor layer 312 has a first thickness (denoted as $L_1$ in FIG. 15B) on vertical sidewalls of the respective semiconductor layer 310 and a second thickness (denoted as $L_2$ in FIG. 15B) on horizontal (i.e., top and bottom) surfaces of the respective semiconductor layer 310. The overall size of each suspended nanostructure in the fin 104 has a thickness $T' \approx T+2*L_2$ and a width $W' \approx W+2*L_1$. In other words, a cross-sectional area of the suspended nanostructure in the fin 104 becomes larger than that in the fin 102. In some embodiments, a cross-sectional area ratio between the suspended nanostructure in the fin 104 and that in the fin 102 is from about 1:1 to about 3:1.

In some embodiments, the first thickness $L_1$ and the second thickness $L_2$ of the semiconductor layer 312 may have different values. For example, the horizontal surfaces and vertical sidewalls may have different orientations that results in different epitaxial growth rate. In one example, the semiconductor layer 310 has a (110) surface in the horizontal surfaces and a (100) surface in the vertical sidewalls. The method 200 at operation 216 may be tuned to excite a higher epitaxial growth rate at the (100) surface than the (110) surface, such that $L_1$ is larger than $L_2$. A ratio between $L_1$ and $L_2$ may range from about 1:1 to about 2:1, such as 1.5:1. A relatively larger $L_1$ and a relatively smaller $L_2$ help to keep the cross-sectional area enlargement with the deposition of the semiconductor layer 312 mainly in the horizontal directions, while maintain a suitable vertical distance between adjacent suspended nanostructures. In yet another example, the semiconductor layer 310 has a (100) surface in the horizontal surfaces and a (110) surface in the vertical sidewalls. The method 200 at operation 216 may include a cyclic process that alternates an epitaxial growth and a selective etching process to achieve an effective higher epitaxial growth rate at the (110) surface than the (100) surface, such that $L_1$ is larger than $L_2$. The cyclic process may first epitaxial grow the (100) and (110) surfaces at the same time with a faster epitaxial growth rate at the (100) surface, such as an epitaxial growth ratio between (100) and (110) surfaces ranging from about 1:1 to about 5:1. The cyclic process then apply a selective etching process that is tuned to target at the (100) surface such that the epitaxial growth at (100) surface is thinned down to be smaller than the (110) surface, such as with an etching selectivity between (100) and (110) surfaces ranging from about 6:1 to about 2:1. The selective etching process keeps the effective epitaxial growth on the (110) surface larger than on the (100) surface. The cyclic process may repeat the epitaxial growth and selective etching process for about 2 to 10 times. After the cyclic process, a ratio between $L_1$ and $L_2$ may range from about 1:1 to about 2:1, such as 1.5:1.

In some embodiments, each semiconductor layer 312 is a conformal layer that has a substantially uniform thickness ($L_1=L_2$). As shown in FIGS. 15A and 15B, each semiconductor layer 312 may have a thickness of about 1.5 nm to about 5 nm, such as 2 nm. In some embodiments, a thickness ratio between a semiconductor layer 310 and its surrounding semiconductor layer 312 is about 2:1 to about 4:1. In other words, the semiconductor layer 312 is thinner than its corresponding semiconductor layer 310. Such a thickness ratio provides the suitable amount of germanium needed to convert the semiconductor layers 310 from n-type to p-type.

As shown in FIG. 15A, each semiconductor layer 310 includes a middle section 310a and two end sections 310b, where the middle section 310a is suspended in space (and to be wrapped around by the gate stack 126 in subsequent steps), and the end sections 310b are engaged (e.g., surrounded or wrapped around) by the gate spacers 330. In an embodiment, since only middle sections 310a are exposed, the semiconductor layers 312 are epitaxially grown only in the middle sections 310a, and not in the end sections 310b, of the suspended nanostructures. In other words, the semiconductor layers 312 are only formed at the gate contact region and stop at the gate spacers 330 (i.e., not extending horizontally into the gate spacers 330 or portions of the semiconductor layers 310 surrounded by the gate spacers 330). A cross section of the end sections 310b remains in a rectangular shape with a width W and a thickness T, which is substantially the same as the dimensions of the semiconductor layer 310 in the fin 102.

Subsequently, the method 200 at operation 218 removes the patterned mask (e.g., the hard mask 336) from the semiconductor structure 100. Any suitable removal processes including dry etching, wet etching, and/or reactive ion etching (RIE) may be used.

Referring to FIGS. 16A and 16B, the method 200 at operation 220 performs an anneal process to drive germanium contained in the semiconductor layers 312 into their corresponding semiconductor layers 310. The germanium contained in the semiconductor layer 312 that covers a top surface of the substrate 302 directly under the bottommost semiconductor layer 310 in the fin 104 is also driven into the substrate 302. The semiconductor structure 100 is exposed to a gas that contains nitrogen (N), phosphorus, or other suitable elements. To avoid oxidation of the semiconductor layers 312 (e.g., silicon germanium), in some embodiments, the gas contains no oxygen content. The conditions of the anneal process are adjusted to control the profile and characteristics of the resulting channel. In an example, the anneal process is performed at temperatures between about 700 degrees Celsius (° C.) to about 1200. The anneal process 410 may be performed for a relatively long period such as 10 seconds to 100 seconds (called "soaking") or a relatively short period such as hundreds of milliseconds to a few seconds (e.g., 200 milliseconds to 2 seconds) (called "spiking").

The anneal process causes germanium atoms, and possibly silicon atoms, contained in the semiconductor layers 312 to diffuse or migrate into the corresponding semiconductor layers 310. On the other hand, silicon atoms contained in the semiconductor layers 310 may also diffuse or migrate into the corresponding semiconductor layers 312. As a result of the migration of atoms, the semiconductor layers 312 decrease in germanium content, and the semiconductor layers 310 increase in germanium content. In an embodiment, the germanium content in the semiconductor layers 312 changes the semiconductor layers 310 from n-type to p-type. Each semiconductor layers 312 and its corresponding semiconductor layer 310 may effectively combine to form a new suspended nanostructure 340, as the material compositions of the semiconductor layers 310 and 312 become the same or similar (e.g., when germanium gets uniformly distributed throughout the semiconductor layers 310 and 312). In an embodiment, after the anneal process, each of the suspended nanostructure 340 is $Si_{1-x}Ge_x$ that includes more than 10% but equal to or less than about 70% ($0.1<x\leq0.7$) Ge in molar ratio, such as from about 10% to about 50% in a particular example. Such a range of Ge is a result of diluting the initial concentration of Ge in the layer 312 and effectively converts the channel region 128 from a first-type (e.g., n-type) to a second-type (e.g., p-type).

Since the suspended nanostructures 340 are formed as a combination of corresponding semiconductor layers 310 and 312, the suspended nanostructures 340 in the fin 104 becomes thicker and wider than the suspended nanostructures 310 in the fin 102. The inventors of the present disclosure have observed that under certain anneal process conditions, driving germanium atoms, and possibly silicon atoms, contained in the semiconductor layers 312 into the corresponding semiconductor layers 310 will also cause surface reconstruction of the resulted suspended nanostructure 340. In some embodiments, the anneal temperature is set slightly below the melting point of germanium but far below the melting point of silicon, such as at a spiking temperature of about 1200 to about 1300 Celsius to facilitate the surface reconstruction. In the illustrated embodiments in FIG. 16B, a cross section of the suspended nanostructure 340 in the channel region transforms from a rectangular shape to an oval shape (including a circular shape). The geometry of end sections 310b and semiconductor layers 310 in the fin 102 remains unchanged. As silicon and/or germanium atoms at the crystal surface lack neighbors, surface reconstruction may occur by absorption of foreign atoms (e.g., germanium atoms). The surface reconstruction may be due to the reduction of surface energy such that solid surfaces are intrinsically less energetically favorable than the bulk of a material (otherwise there would be a driving force for surfaces to be created, removing the bulk of the material). As a result, silicon atoms at the crystal surface have a tendency to move away from unfavorable high energy positions and to bond with more neighbors in order to reduce surface energy level. The matter flow thus changes the geometry of surface layers and reconstructs the original surface to have a curvature shape. A region 350 containing one suspended nanostructure 340 is depicted to further illustrate the surface reconstruction. The oval solid line represents the cross section of the suspended nanostructure 340 after the surface reconstruction. The two dotted rectangular boxes represent the suspended nanostructure before and after the deposition of the semiconductor layer 312, prior to the surface reconstruction, respectively. The surface reconstruction causes the four corners of the suspended nanostructure 340 to retreat, centers of the upper and lower surfaces to protrude, and centers of the vertical sidewalls to expand. As a result, the oval shape has an enlarged thickness T" (T">T', e.g., about 5% larger) and an enlarged width W" (W">W', e.g., about 5% larger). Even though the oval shape has enlarged thickness T" and enlarged width W", the cross-sectional area substantially remains the same, due to the retreat of the four corner areas. In some embodiments, after the surface reconstruction, a cross-sectional area ratio between the suspended nanostructure in the fin 104 and that in the fin 102 is from about 1.4:1 to about 2:1. If the ratio is less than 1.4:1, the low carrier mobility of holes in p-type channel may not be sufficiently compensated by larger effective width. If the ratio is larger than 2:1, the distance between adjacent suspended nanostructures may become small and cause filling issues during the metal gate stack formation later on. Comparing with the suspended nanostructures in the fin 102, in some embodiments, a ratio of T"/T is no less than 1.2:1, such as from about 1.2:1 to about 2:1; a ratio of W"/W is no less than 1.2:1, such as from about 1.2:1 to about 2:1.

Figure 17:
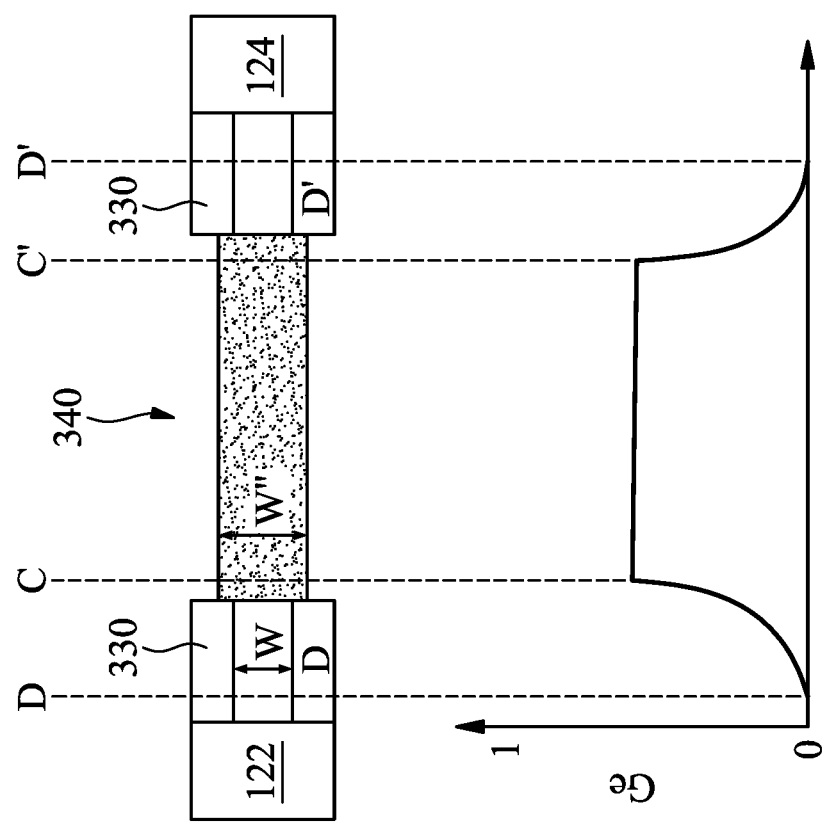

During the anneal process, germanium atoms in the semiconductor layers 312 may diffuse mostly into the middle sections 310a (and not the end sections 310b) of corresponding the suspended nanostructures. FIG. 17 illustrates an example concentration profile of germanium in the X-cut direction (along the line taken in FIG. 16A). As shown in FIG. 17, a concentration of germanium in the middle section of each channel 340 is higher than a concentration of the germanium in the two end sections of the channel 340. Any suitable methods of determining concentration may be used (e.g., by determining an average concentration or median concentration). In an embodiment, the concentration of the germanium in the middle section of each channel 340 is substantially uniform, while the concentration of the germanium in the end sections of each channel 340 takes a gradient profile (e.g., gradually decreasing from the high concentration in the middle section until the concentration becomes zero). Note that, due to the spreading nature of germanium migration in the anneal process, the concentration of germanium may start to decrease at points C and C' shown in FIG. 17, which may be a few nanometers (e.g., about 1 nm to about 2 nm) off from the interface between the middle section and an end section. In some embodiments (for example, when the anneal process has a short duration and/or low temperatures), germanium does not reach far enough under the gate spacers 330 to reach the source region 122 and the drain region 124. Instead, the concentration of germanium drops to zero at the points D and D' shown in FIG. 17. Thus, at least a portion of the two end sections— which is in direct contact with the gate spacers 330, the source region 122, and the drain region 124—is substantially devoid of germanium. In an embodiment, the entire end sections of the channel 340 are substantially devoid of germanium. The various concentration profiles of germanium in the Y-cut direction (along the line taken in FIG. 16B) has been discussed above in association with FIG. 12B and would be skipped herein for the sake of simplicity.

The method 200 subsequently may skip operation 222 without trimming thickness and/or width of the suspended nanostructures in the fin 104. With a relatively larger cross-sectional area in p-type transistor channels than in n-type transistor channels, the p-type transistor has a larger effective width, which compensates the relatively slow hole mobility in p-type channels and increase p-type transistor performance. In an embodiment, the method 200 continues to operation 224 in forming the gate stacks 116 and 126, as illustrated in FIG. 1A.

Figure 18:
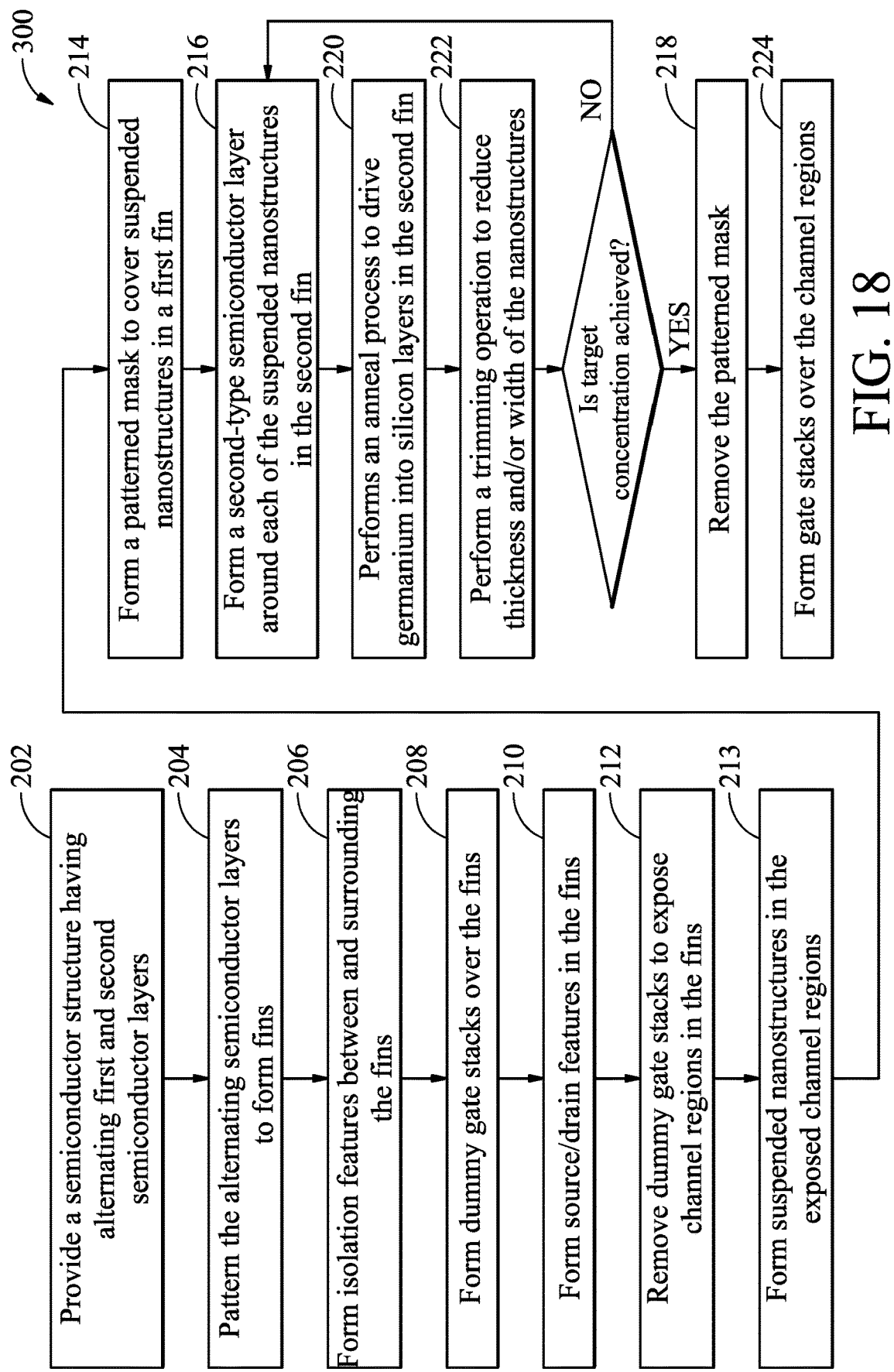
FIG. 18 is a flowchart of another method of forming a semiconductor device according to various aspects of the present disclosure.

FIG. 18 is a flowchart of a method 300 of forming the semiconductor device structure 100 with high germanium concentration in p-type channels, according to various aspects of the present disclosure. The method 300 is merely an example and is not intended to limit the present disclosure beyond what is explicitly recited in the claims. Additional operations can be provided before, during, and after the method 300, and some operations described can be replaced, eliminated, or moved around for additional embodiments of the method. Some embodiments of method 300 are described below in conjunction with FIGS. 19A-19C which are Y-cut cross-sectional views of the semiconductor structure 100 (taken along the line B-B' in FIG. 1A). Some aspects of the method 300 are the same as the method 200, and will be briefly discussed below. Other aspects of the method 300 are different from the method 200, and will be described in more details.

The method 300 includes operations 202-224 which are the same as those as discussed above with reference to method 200 in FIG. 2. One of the differences between methods 300 and 200 is that the method 300 reiterate operations 216, 220, and 222 to achieve a high germanium concentration which is otherwise hard to achieve by depositing and anneals germanium containing layer 312 for only once. In some embodiments, after operations 216 and 220, the method 300 forms suspended nanostructure 340 with a first germanium concentration in molar ratio, as shown in FIG. 19A. In various embodiments, the first germanium concentration is more than 10% but equal to or less than about 70% ($0.1 < x \leq 0.7$), such as from about 10% to about 50% in a particular example. To achieve an even higher germanium concentration, the method 300 proceeds to operation 222 to reduce the thickness and width of the suspended nanostructure 340 in order to spare space for a deposition of germanium containing layer 312 for another round, as shown in FIG. 19B. The trimming operation uses any suitable etching process such as dry etching, wet etching, and/or RIE. In an embodiment, the suspended nanostructures 340 in the fin 104 are trimmed to have about the same thickness and/or width as the suspended nanostructures 310 in the fin 102. Subsequently, the method 300 repeats operation 216 to deposit a germanium containing layer 312 wrapping around the trimmed suspended nanostructures 340, as shown in FIG. 19C. The germanium containing layer 312 includes a germanium concentration sufficiently higher than a predetermined germanium concentration value to achieve in the suspended nanostructures 340. In some embodiments, a predetermined target value is about 80% germanium in molar ratio and the germanium containing layer 312 may include a germanium concentration larger than 80%, such as about 90%. The method 300 then repeats operation 222 to drive germanium into the suspended nanostructures 340 and operation 222 to trim the suspended nanostructures 340 to spare space for deposition of next round. Each iteration increases the germanium concentration in the suspended nanostructures 340 towards the predetermined target concentration. Once the predetermined target concentration is achieved, the method 300 may either perform one last round of operation 222 to trim the suspended nanostructures 340 or optionally skip operation 222 to keep a relatively larger cross-sectional area in p-channels.

In either method 200 or method 300, further processes may be performed to complete the fabrication of the semiconductor structure 100. For example, the method may continue to form contact openings, contact metal, as well as various contacts, vias, wires, and multilayer interconnect features (e.g., metal layers and interlayer dielectrics) over the substrate 302, configured to connect the various features to form a functional circuit that may include one or more multi-gate devices.

Although not intended to be limiting, one or more embodiments of the present disclosure provide many benefits to a semiconductor device and a formation process thereof. For example, embodiments of the present disclosure form dual channel GAA FET devices on multiple fins. According to some embodiments, after growing a stack of alternating n-type and p-type semiconductor layers, a method directly patterns the stack to create first and second fins, and then removes the p-type semiconductor layers to create suspended p-type nanostructures on both fins. The method then converts the suspended p-type nanostructures of the second fin to p-type nanostructures by growing thin p-type semiconductor (e.g., germanium or silicon germanium) layers that wrap around the suspended p-type nanostructures and then performing an anneal process to drive germanium atoms into the suspended p-type nanostructures. As a result, dual channel GAA FETs are achieved with a simplified fabrication process. In some embodiments, the channels only have germanium at a gate contact region (not end sections under gate spacers). Further, embodiments of the present disclosure may be integrated into existing CMOS fabrication flow, providing for improved process window.

In one example aspect, the present disclosure provides a method of forming a semiconductor device. The method includes providing a substrate having a plurality of first semiconductor layers and a plurality of second semiconductor layers disposed over the substrate, wherein the first and second semiconductor layers have different material compositions and are alternatingly disposed with respect to each other in a vertical direction, wherein each of the first and second semiconductor layers extends over first and second regions of the substrate; patterning the first semiconductor layers and the second semiconductor layers to form a first fin in the first region and a second fin in the second region; removing the first semiconductor layers from the first and second fins such that a first portion of the patterned second semiconductor layers becomes first suspended nanostructures in the first fin and that a second portion of the patterned second semiconductor layers becomes second suspended nanostructures in the second fin; forming a plurality of third semiconductor layers on the second suspended nanostructures in the second fin; and performing an anneal process to drive materials contained in the third semiconductor layers into corresponding second suspended nanostructures in the second fin.

In another example aspect, the present disclosure provides a method that includes forming a plurality of first suspended layers in a first fin and a plurality of second suspended layers in a second fin, wherein the first and second suspended layers include a same first semiconductor material; epitaxially growing a plurality of third layers on the second suspended layers in the second fin, wherein the third layers include a second semiconductor material that differs from the first semiconductor material; and driving the second semiconductor material to migrate from the third layers into corresponding second layers in the second fin.

In yet another example aspect, the present disclosure provides a semiconductor structure. The semiconductor structure includes a substrate; a fin disposed on the substrate, the fin comprising a source region, a drain region, and a channel region disposed between the source and drain regions, the channel region comprising a plurality of channels vertically stacked over one another, the channels comprising germanium distributed therein; a gate stack engaging the channel region of the fin; and gate spacers disposed between the gate stack and the source and drain regions of the fin. Each of the channels includes a middle section wrapped around by the gate stack and two end sections engaged by the gate spacers. A concentration of germanium in the middle section of each channel is higher than a concentration of germanium in the two end sections of the channel.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a fin disposed on the substrate, the fin including a source region, a drain region, and a channel region disposed between the source and drain regions, the channel region comprising a plurality of channels vertically stacked over one another, the channels comprising germanium distributed therein;
   a gate stack engaging the channel region of the fin; and
   gate spacers disposed between the gate stack and the source and drain regions of the fin,
   wherein each channel of the channels includes a middle section wrapped around by the gate stack and two end sections engaged by the gate spacers, wherein a concentration of germanium in the middle section is higher than a concentration of germanium in the two end sections, and wherein the middle section further includes a core portion and an outer portion surrounding the core portion and has a germanium concentration profile from the core portion to the outer portion.

2. The semiconductor structure of claim 1, wherein the concentration of germanium in the middle section is substantially uniform and the concentration of germanium in each of the two end sections has a gradient profile.

3. The semiconductor structure of claim 1, wherein
   at least a portion of the two end sections, which is in direct contact with the gate spacers is substantially devoid of germanium;
   the fin is a first fin and the channels are first channels that form part of a p-type transistor; and
   the semiconductor structure further includes a second fin disposed on the substrate that forms part of an n-type transistor, wherein the second fin includes a plurality of second channels stacked over one another, and wherein the second channels are different from the first channels in composition and include silicon.

4. The semiconductor structure of claim 1, wherein the core portion and the outer portion have a uniform concentration of germanium ranging from about 34% to about 38%.

5. The semiconductor structure of claim 1, wherein the outer portion has a first concentration of germanium ranging from about 26% to about 30%; and the core portion has a second concentration of germanium lower than the first concentration of germanium by about 1%.

6. The semiconductor structure of claim 1, wherein the core portion and the outer portion have a uniform concentration of germanium ranging from about 18% to about 22%.

7. The semiconductor structure of claim 1, wherein the concentration of germanium in the middle section has a gradient profile with a maximal germanium concentration ranging from about 18% to about 22% in the outer portion and a minimal germanium concentration ranging from about 11% to about 13% in the core portion.

8. The semiconductor structure of claim 1, wherein the concentration of germanium in the middle section ranges from about 26% to about 30%.

9. The semiconductor structure of claim 1, wherein the core portion and the outer portion have a uniform concentration of germanium ranging from about 9% to about 11%.

10. The semiconductor structure of claim 1, wherein
    the fin extends lengthwise in a first direction;
    the middle section has a first cross section perpendicular to the first direction;
    each of the two end sections has a second cross section perpendicular to the first direction; and
    a first size of the first cross section is greater than a second size of the second cross section.

11. A semiconductor structure, comprising:
    a substrate;
    a fin disposed on the substrate and extending lengthwise in a first direction, the fin including a source region, a drain region, and a channel region disposed between the source and drain regions, the channel region comprising a plurality of channels vertically stacked over one another, the channels comprising germanium distributed therein;
    a gate stack engaging the channel region of the fin; and
    gate spacers disposed between the gate stack and the source and drain regions of the fin,
    wherein each channel of the channels includes a middle section wrapped around by the gate stack and two end sections engaged by the gate spacers, wherein a concentration of germanium in the middle section is higher than a concentration of germanium in the two end sections, and wherein the middle section has a first cross section perpendicular to the first direction, wherein each of the two end sections has a second cross section perpendicular to the first direction, and wherein a first size of the first cross section is greater than a second size of the second cross section.

12. The semiconductor structure of claim 11, wherein the middle section of the channel further includes a core portion and an outer portion surrounding the core portion and has an uneven germanium concentration profile from the core portion to the outer portion.

13. The semiconductor structure of claim 12, wherein the concentration of germanium in each of the two end sections has a gradient profile.

14. The semiconductor structure of claim 12, wherein
    at least a portion of the two end sections, which is in direct contact with the gate spacers, the source region, and the drain region, is substantially devoid of germanium;
    the fin is a first fin and the channels are first channels that form part of a p-type transistor; and
    the semiconductor structure further includes a second fin disposed on the substrate that forms part of an n-type transistor, wherein the second fin includes a plurality of second channels stacked over one another, and wherein each of the second channels is a silicon channel.

15. The semiconductor structure of claim 12, wherein the outer portion has a first concentration of germanium ranging from about 26% to about 30%; and the core portion has a second concentration of germanium lower than the first concentration of germanium by about 1%.

16. The semiconductor structure of claim 12, wherein a concentration of germanium in the middle section has a gradient profile with a maximal germanium concentration ranging from about 18% to about 22% in the outer portion and a minimal germanium concentration ranging from about 11% to about 13% in the core portion.

17. A semiconductor structure, comprising:
a first fin disposed on a substrate, the first fin including a first source region, a first drain region, and a first channel region disposed between the first source region and first drain region, wherein the first channel region includes a plurality of first channels that form part of a p-type transistor and are vertically stacked over one another, the first channels including silicon germanium; and
a second fin disposed on the substrate, the second fin including a second source region, a second drain region, and a second channel region disposed between the second source and second drain regions, wherein the second channel region includes a plurality of second channels that forms part of an n-type transistor and are vertically stacked over one another, wherein the second channels is different from the first channels in composition and includes silicon, and wherein each of the first channels is different from each of the second channels in size.

18. The semiconductor structure of claim 17, wherein the each of the first channels is thicker and wider than the each of the second channels.

19. The semiconductor structure of claim 18, further comprising:
a first gate stack engaging the first channel region of the first fin; and
first gate spacers disposed between the first gate stack and the first source and first drain regions of the first fin,
wherein the each of the first channels includes a middle section wrapped around by the first gate stack and two end sections engaged by the first gate spacers, wherein a concentration of germanium in the middle section of the each of the first channels is higher than a concentration of germanium in the two end sections of the each of the first channels, and wherein the middle section of the each channel further includes a core portion and an outer portion surrounding the core portion with an uneven germanium concentration profile from the core portion to the outer portion.

20. The semiconductor structure of claim 19, wherein
the first fin extends lengthwise in a first direction;
the middle section of the each of the first channels has a first cross section perpendicular to the first direction;
each of the two end sections of the each of the first channels has a second cross section perpendicular to the first direction; and
a first size of the first cross section is greater than a second size of the second cross section.

* * * * *